(12) United States Patent
Chang et al.

(10) Patent No.: US 10,867,892 B1
(45) Date of Patent: Dec. 15, 2020

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Chih-Horng Chang, Taipei (TW); Cheng-Yen Hsieh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/548,835

(22) Filed: Aug. 22, 2019

(51) Int. Cl.
*H01L 23/10* (2006.01)
*H01L 23/34* (2006.01)
*H01L 23/48* (2006.01)
*H01L 23/373* (2006.01)
*H01L 27/16* (2006.01)
*H01L 23/498* (2006.01)
*H01L 23/00* (2006.01)
*H01L 25/065* (2006.01)
*H01L 23/31* (2006.01)

(52) U.S. Cl.
CPC ........ *H01L 23/481* (2013.01); *H01L 23/3128* (2013.01); *H01L 23/373* (2013.01); *H01L 23/49827* (2013.01); *H01L 24/16* (2013.01); *H01L 25/0657* (2013.01); *H01L 27/16* (2013.01); *H01L 2224/02331* (2013.01); *H01L 2224/12105* (2013.01)

(58) Field of Classification Search
CPC .......... H01L 35/30; H01L 27/16; H01L 35/00
USPC .................. 257/706, 707, 930; 438/122, 127
See application file for complete search history.

(56) References Cited

U.S. PATENT DOCUMENTS 5,895,964 A * 4/1999 Nakayama .............. H01L 23/38
257/577
9,000,584 B2 4/2015 Lin et al.
(Continued)

OTHER PUBLICATIONS

Wen P. Lin, Daniel E. Wesolowski, Chin C. Lee "Barrier/bonding layers on bismuth telluride (Bi2Te3) for high temperature thermoelectric modules".
(Continued)

*Primary Examiner* — S. V. Clark
(74) *Attorney, Agent, or Firm* — WPAT, P.C., Intellectual Property Attorneys; Anthony King

(57) ABSTRACT

A semiconductor structure includes a first die including a first surface and a second surface opposite to the first surface; a first molding surrounding the first die; and a first redistribution layer (RDL) disposed over the second surface of the first die and the first molding, and including a first dielectric layer, a first interconnect structure surrounded by the first dielectric layer, and a cooling mechanism disposed within the first dielectric layer, wherein the cooling mechanism includes a first conductive member, a second conductive member disposed opposite to the first conductive member, a first thermoelectric member and a second thermoelectric member adjacent to the first thermoelectric member; and wherein the first thermoelectric member and the second thermoelectric member extend substantially in parallel to the second surface of the first die and extend between the first conductive member and the second conductive member.

20 Claims, 19 Drawing Sheets

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,468,330 B2 * | 11/2019 | Yang ............... H01L 27/16 |
| 2003/0184941 A1 * | 10/2003 | Maeda ............... H01L 23/38 361/103 |
| 2016/0163942 A1 * | 6/2016 | Emadi ............... G01J 5/024 257/467 |

OTHER PUBLICATIONS

"Introduction of application of thermoelectric materials".

Wei Zhu, Yuan Deng, Min Gao, Yao Wang, Jiaolin Cui, Hongli Gao "Thin-film solar thermoelectric generator with enhanced power output: Integrated optimization design to obtain directional heat flow".

G. Jeffrey Snyder, Marco Soto, Randy Alley, David Koester, Bob Conner "Hot Spot Cooling using Embedded Thermoelectric Coolers".

R. Roth, R. Rostek, G. Lenk, M. Kratschmer, K. Cobry, and P. Woias "Two-Layer Process for a Micro Thermoelectric Cross-Plane Generator With Electroplating and Reflow Soldering".

\* cited by examiner

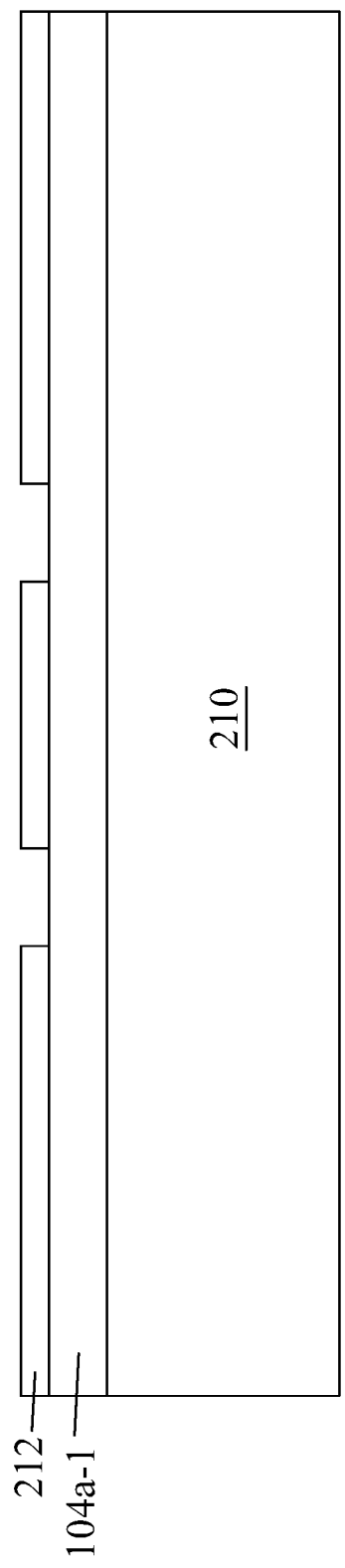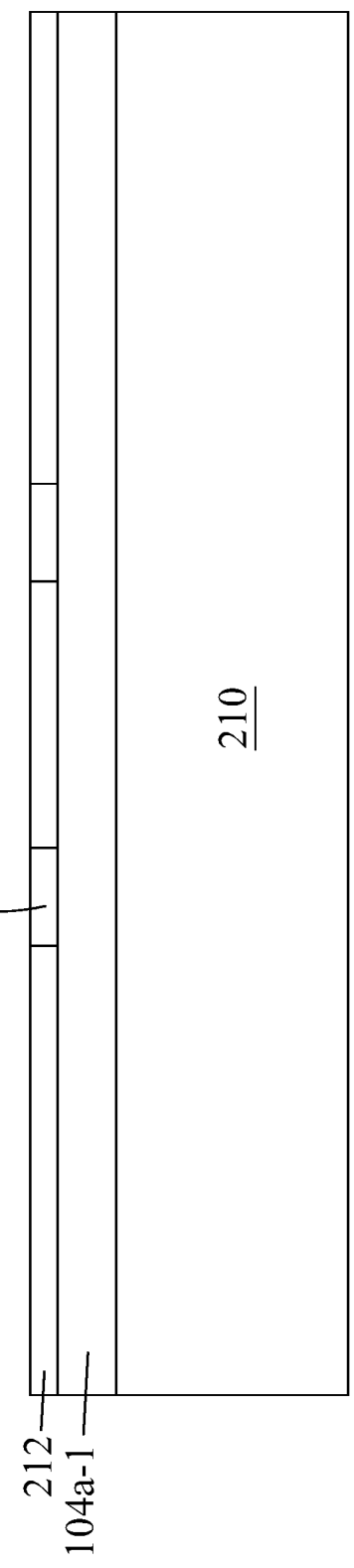

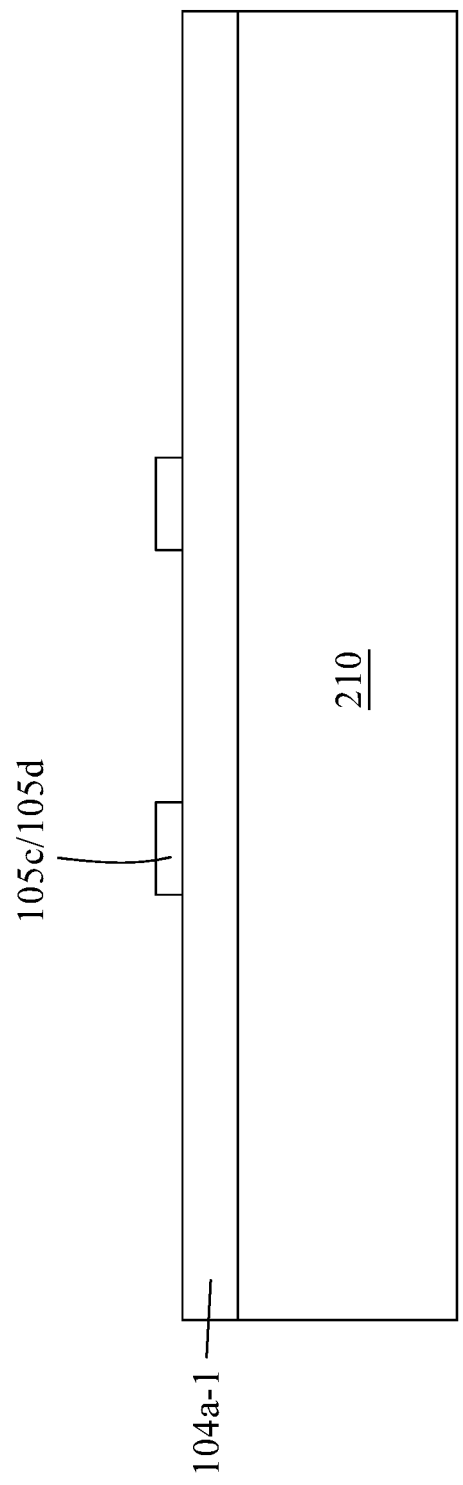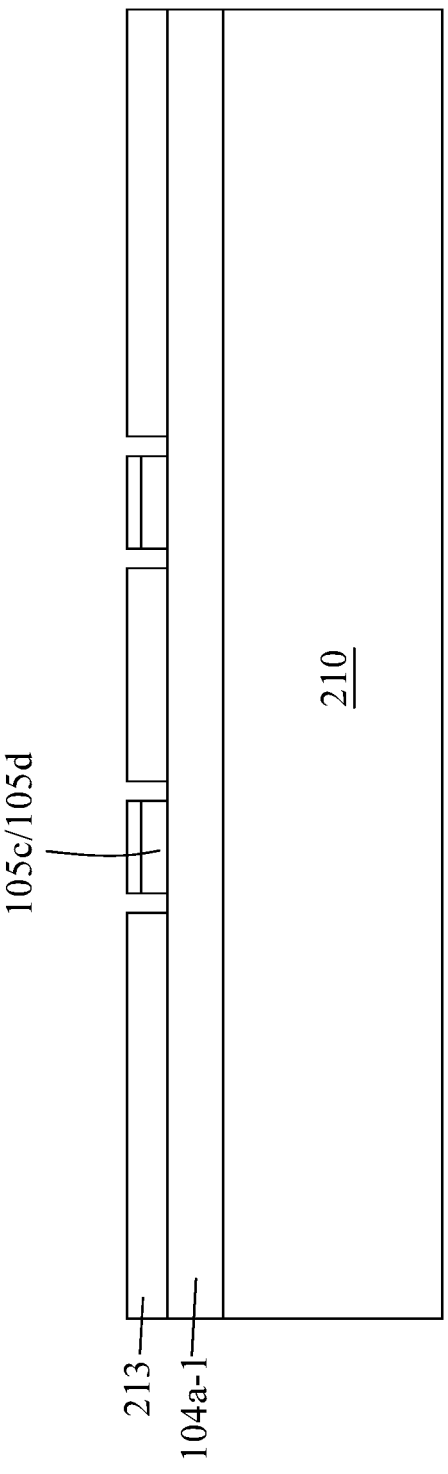

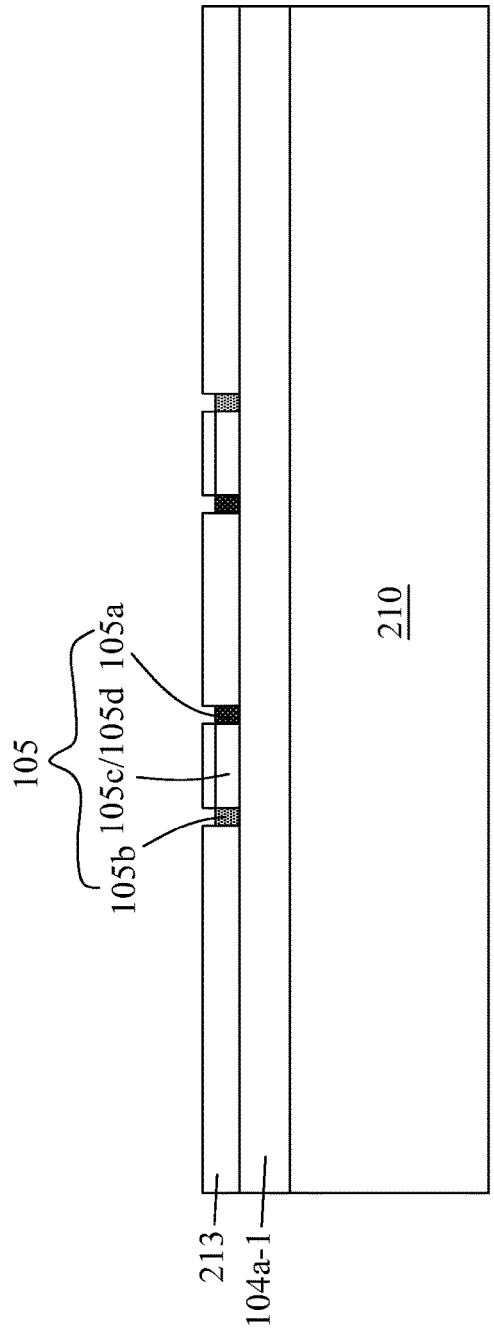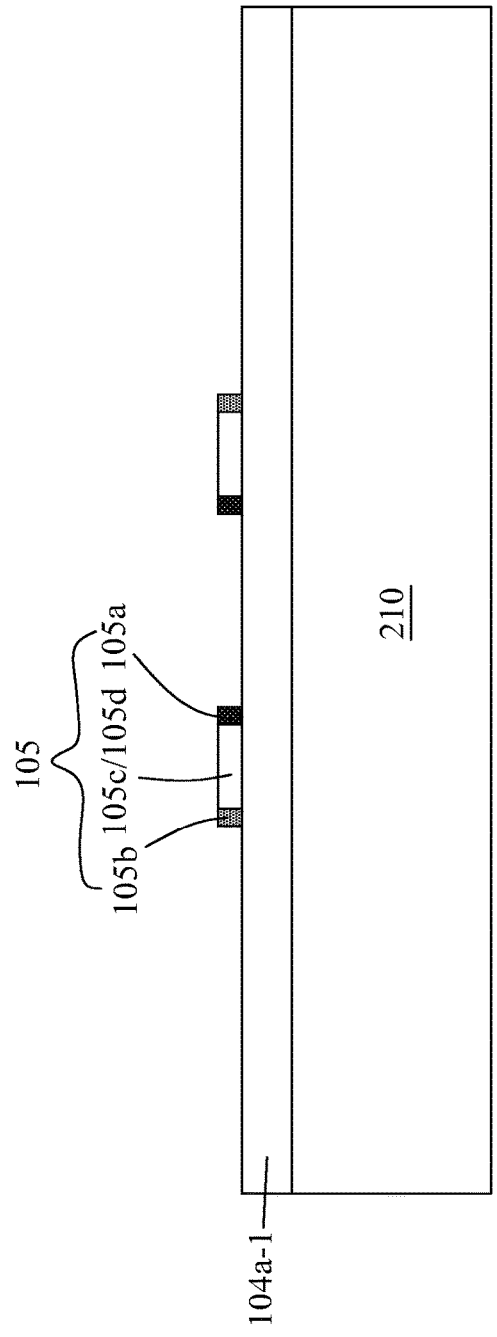

SEMICONDUCTOR STRUCTURE AND MANUFACTURING METHOD THEREOF

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Due to the miniaturized scale of the semiconductor device, a chip on wafer on substrate (CoWoS), integrated fan out (InFO) package, package on package (PoP) and three-dimensional integrated circuit (3DIC) are widely implemented to integrate or stack several chips to become a single semiconductor device.

Fabrication of the semiconductor device involves many steps and operations on such a small and thin semiconductor device. Therefore, the manufacturing of the semiconductor device in a miniaturized scale becomes more complicated. Further, more different components with different materials are involved, which implies a demand on thermal management and heat dissipation efficiency due to high power density of the semiconductor device.

As such, there are many challenges for modifying a structure of the semiconductor device and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
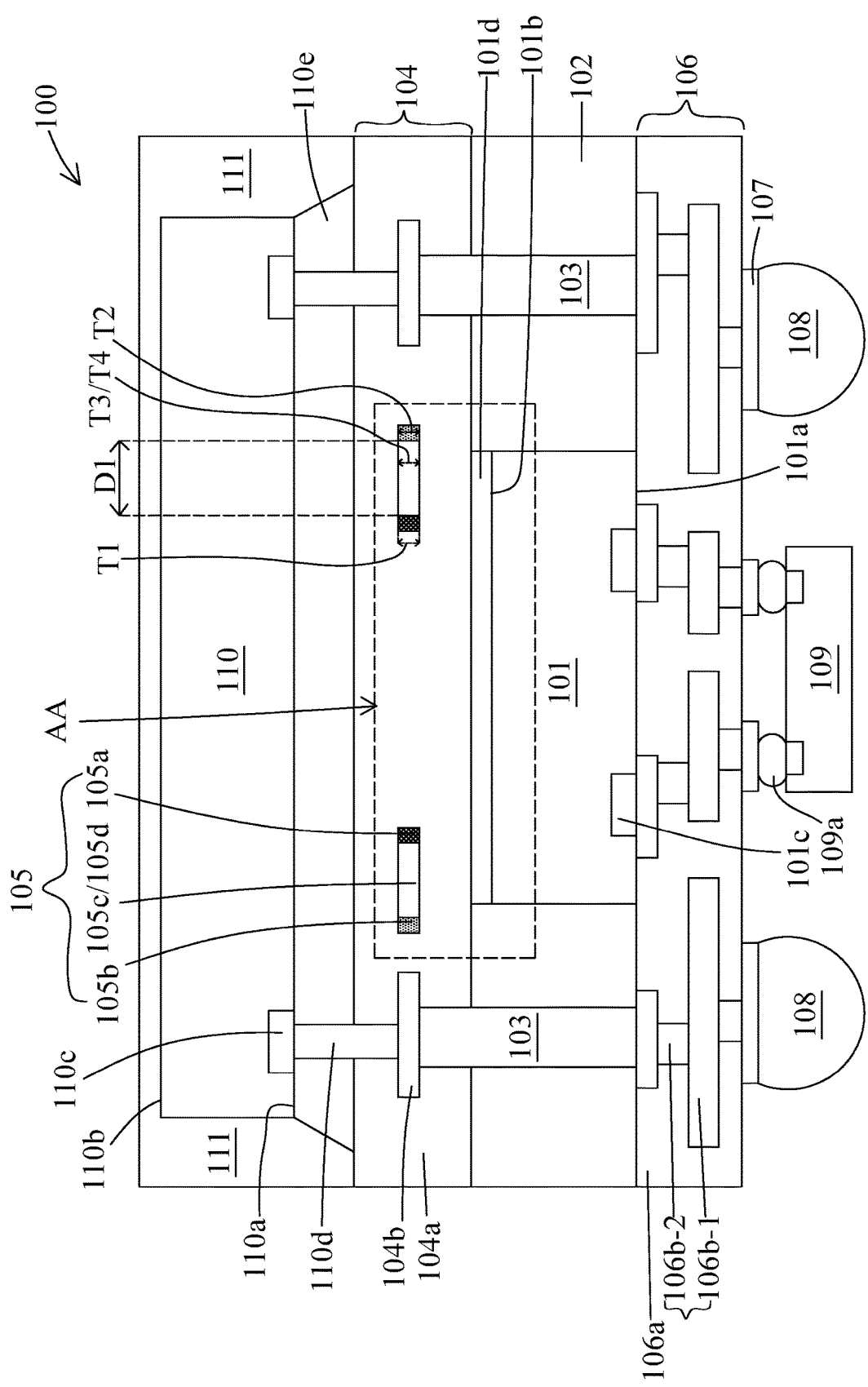
FIG. 1 is a schematic cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this document, the term "coupled" may also be termed as "electrically coupled", and the term "connected" may be termed as "electrically connected". "Coupled" and "connected" may also be used to indicate that two or more elements cooperate or interact with each other.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

A semiconductor structure is manufactured by a number of operations. During manufacturing of the semiconductor structure, semiconductor chips with different functionalities and dimensions are stacked over each other and integrated into a single module. The semiconductor chip is disposed on a substrate or another semiconductor chip, and a molding is formed to encapsulate the semiconductor chips. During a working of the semiconductor structure, each of the semiconductor chips may emanate a heat. If the heat is accumulated inside the semiconductor structure, performance of the semiconductor chips may decrease. Reliability and performance of the semiconductor structure would be adversely affected. Therefore, a heat dissipation mechanism shall be included in the semiconductor structure in order to dissipate the heat to the surroundings and maintain the efficiency of the working of the semiconductor structure.

In the present disclosure, a semiconductor structure is disclosed. The semiconductor structure includes a die including a first surface and a second surface opposite to the first surface; a molding surrounding the die; and a redistribution layer (RDL) disposed over the second surface of the die and the molding, and including a dielectric layer, an interconnect structure surrounded by the dielectric layer, and a cooling mechanism disposed within the dielectric layer, wherein the cooling mechanism includes a first conductive member, a second conductive member disposed opposite to the first conductive member, a first thermoelectric member and a second thermoelectric member adjacent to the first thermoelectric member; and wherein the first thermoelectric member and the second thermoelectric member extend substantially in parallel to the second surface of the die and extend between the first conductive member and the second conductive member.

The cooling mechanism can direct a heat emanated from the die towards a periphery of the semiconductor structure. The heat can be effectively and efficiently dissipate to the surroundings by the cooling mechanism. As such, performance of the semiconductor structure can be maintained or enhanced. Further, the thermoelectric members extend horizontally over the die and the molding, a thickness of the cooling mechanism can be minimized. Therefore, an overall form factor of the semiconductor structure can also be minimized or reduced.

Figure 2:
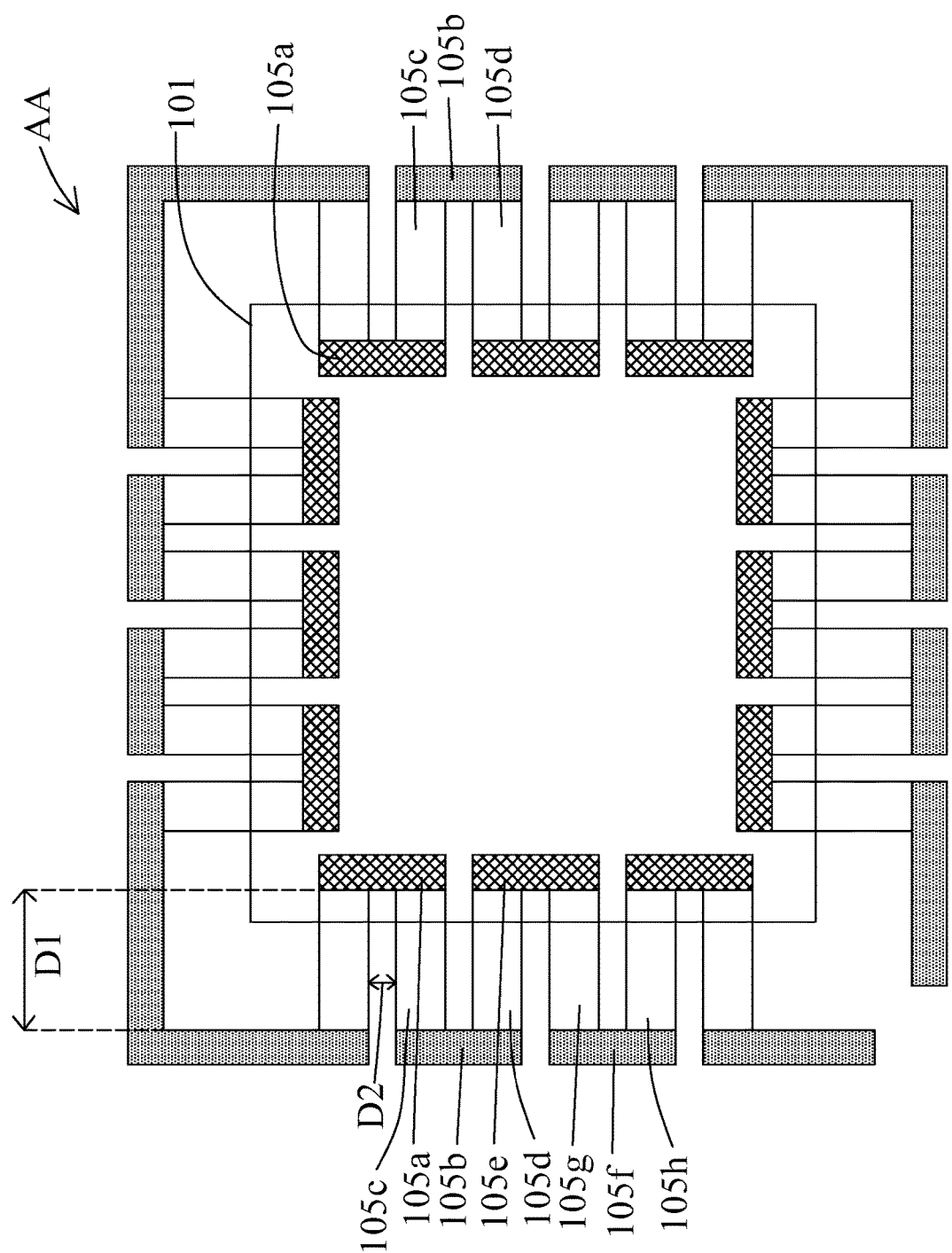
FIG. 2 is an enlarged schematic cross-sectional view of a portion AA of the semiconductor structure in FIG. 1.

FIG. 1 is a schematic cross-sectional view of a semiconductor structure 100 in accordance with various embodiments of the present disclosure. FIG. 2 is an enlarged top cross-sectional view of a portion AA in FIG. 1. In some embodiments, the semiconductor structure 100 includes a first die 101, a first molding 102, a first redistribution layer (RDL) 104 and a cooling mechanism 105.

In some embodiments, the semiconductor structure 100 is a semiconductor package. In some embodiments, the semiconductor structure 100 is a part of a semiconductor package. In some embodiments, the semiconductor structure 100 is an integrated fan out (InFO) package, where I/O terminals of the first die 101 is fanned out and redistributed over a surface of the first die 101 in a greater area. In some embodiments, the semiconductor structure 100 is a three dimensional integrated circuit (3D IC). In some embodiments, the semiconductor structure 100 is a chip on wafer on substrate (CoWoS) structure.

In some embodiments, the first die 101 is fabricated with a predetermined functional circuit within the first die 101 produced by photolithography operations. In some embodiments, the first die 101 is singulated from a semiconductive wafer by a mechanical or laser blade. In some embodiments, the first die 101 comprises a variety of electrical circuits suitable for a particular application. In some embodiments, the electrical circuits include various devices such as transistors, capacitors, resistors, diodes and/or the like.

In some embodiments, the first die 101 is a logic device die, central computing unit (CPU) die, or the like. In some embodiments, first die 101 is a system on chip (SoC). In some embodiments, the first die 101 has a top cross section (a cross section from a top view of the semiconductor structure 100 as shown in FIG. 2) in a quadrilateral, a rectangular or a square shape. FIG. 1 illustrates the semiconductor structure 100 includes one first die 101, however it is understood that the semiconductor structure 100 can include more than one first dies 101. It is not intended to limit a number of dies in the semiconductor structure 100.

In some embodiments, the first die 101 includes a first surface 101a and a second surface 101b opposite to the first surface 101a. In some embodiments, the first surface 101a of the first die 101 is a front or active side of the first die 101. In some embodiments, the second surface 101b is a back or inactive side of the first die 101.

In some embodiments, the first die 101 includes several first die pads 101c disposed over or within the first die 101. In some embodiments, the first die pad 101c is disposed over the first surface 101a of the first die 101. In some embodiments, the first die pad 101c is electrically connected to a circuitry over or within the first die 101. In some embodiments, the first die pad 101c is configured to electrically connect to a circuitry external to the first die 101. In some embodiments, the first die pad 101c is configured to electrically couple with a conductive trace or a conductive structure. In some embodiments, the first die pad 101c includes gold, silver, copper, nickel, tungsten, aluminum, palladium and/or alloys thereof. FIG. 1 illustrates only two first die pad 101c over the first die 101 for clarity and simplicity, however, an ordinarily skilled person in the art would readily understand that one or more first die pads 101c can be present over the first die 101.

In some embodiments, an adhesive 101d is disposed over the second surface 101b of the first die 101. In some embodiments, the adhesive 101d is die attach film (DAF), a glue, a polymer material, or the like. In some embodiments, the adhesive 101d is ultra-violet (UV) glue, which loses its adhesive property when exposed to UV lights. In some embodiments, the adhesive 101d includes an epoxy-based thermal-release material, which loses its adhesive property when heated. In some embodiments, the adhesive 101d is a Light-to-Heat-Conversion (LTHC) release coating.

In some embodiments, the first molding 102 surrounds the first die 101. In some embodiments, the first molding 102 is in contact with a sidewall of the first die 101. In some embodiments, the first molding 102 is not in contact with the second surface 101b of the first die 101. In some embodiments, the first molding 102 disposed over the second surface 101b and the adhesive 101d is absent. In some embodiments, the first molding 102 can be a single layer film or a composite stack. In some embodiments, the first molding 102 has a high thermal conductivity, a low moisture absorption rate and a high flexural strength. In some embodiments, the first molding 102 includes various materials, such as molding compound, molding underfill, epoxy, resin, or the like.

In some embodiments, a via 103 extends through the first molding 102. In some embodiments, the via 103 is disposed within the first molding 102. In some embodiments, an end of the via 103 is at least partially exposed from the molding 102. In some embodiments, the via 103 is protruded from the first molding 102. In some embodiments, the via 103 includes a conductive material such as copper, silver, gold, aluminum, etc. In some embodiments, the via 103 is a through molding via (TMV). In some embodiments, a height of the via 103 is substantially same as a thickness of the first die 101 or a thickness of the first molding 102. In some embodiments, the height of the via 103 is substantially greater than the thickness of the first die 101 and the thickness of the first molding 102.

In some embodiments, the first RDL 104 is disposed over the first die 101, the first molding 102 and the via 103. In some embodiments, the first RDL 104 is disposed over the second surface 101b of the first die 101. In some embodiments, the first RDL 104 surrounds a portion of the via 103 protruded from the first molding 102. In some embodiments, the first RDL 104 is configured to route a path of circuitry and redistribute I/O terminals of a die. In some embodiments, the first RDL 104 includes a first dielectric layer 104a and a first interconnect structure 104b surrounded by the first dielectric layer 104a. In some embodiments, the first RDL 104 is a back side RDL.

In some embodiments, the first dielectric layer 104a is disposed over the first die 101, the first molding 102 and the via 103. In some embodiments, the first dielectric layer 104a is disposed over the second surface 101b of the first die 101. In some embodiments, the first dielectric layer 104a is in contact with the first molding 102 and the adhesive 101d. In some embodiments, the first dielectric layer 104a includes several layers of dielectric material stacking over each other. In some embodiments, the first dielectric layer 104a is a single dielectric layer. In some embodiments, the first dielectric layer 104a is multiple dielectric layers. In some embodiments, the first dielectric layer 104a includes dielectric material such as silicon oxide, silicon nitride, undoped silicon glass or the like. In some embodiments, the first dielectric layer 104a includes polymeric material such as polyimide (PI), polybenzoxazole (PBO) or the like. In some embodiments, the first dielectric layer 104a includes several dielectric layers with dielectric material different from or same as each other.

In some embodiments, the first interconnect structure 104b is surrounded by the first dielectric layer 104a. In some embodiments, the first interconnect structure 104b is disposed within or over the first dielectric layer 104a. In some embodiments, the first interconnect structure 104b extends within the first dielectric layer 104a. In some embodiments, the first interconnect structure 104b extends through one or more layers of the first dielectric layer 104a. In some embodiments, the first interconnect structure 104b is electrically connected to the via 103. In some embodiments, the first interconnect structure 104b is directly coupled with the via 103. In some embodiments, the first interconnect structure 104b includes conductive material such as gold, silver, copper, nickel, tungsten, aluminum, tin and/or alloys thereof.

In some embodiments, the first interconnect structure 104b includes a first land portion and a first via portion extended from and coupled with the first land portion. In some embodiments, the first land portion is laterally extended within or over the first dielectric layer 104a. In some embodiments, the first via portion is vertically extended within the first dielectric layer 104a and passes through at least one layer of the first dielectric layer 104a. In some embodiments, the first land portion 104b-1 and the first via portion are stacked over each other. In some embodiments, the first land portion and the first via portion are stacked alternately.

In some embodiments, the first land portion is disposed over the first dielectric layer 104a. In some embodiments, the first land portion is at least partially exposed from the first dielectric layer 104a. In some embodiments, the first land portion is a bonding pad for receiving, bonding with or electrically connecting with a conductive structure or a circuitry. In some embodiments, the first land portion is disposed over and bonded with the via 103, such that the via 103 is electrically connected to the first interconnect structure 104b.

In some embodiments, the cooling mechanism 105 is included in the first RDL 104. In some embodiments, the cooling mechanism 105 is disposed within the first dielectric layer 104a. In some embodiments, the cooling mechanism 105 is configured to dissipate heat from the first die 101 to a periphery of the semiconductor structure 100 or the surroundings. In some embodiments, the cooling mechanism 105 is disposed over the first die 101. In some embodiments, the cooling mechanism 105 is a thermoelectric cooler (TEC). In some embodiments, the cooling mechanism 105 is surrounded by the first interconnect structure 104b.

In some embodiments, the cooling mechanism 105 includes a first conductive member 105a, a second conductive member 105b, a first thermoelectric member 105c and a second thermoelectric member 105d. In some embodiments, the first conductive member 105a, the second conductive member 105b, the first thermoelectric member 105c and the second thermoelectric member 105d are electrically in series. In some embodiments, the second conductive member 105b is configured to connect to an electric source or a voltage.

In some embodiments, the first conductive member 105a and the second conductive member 105b are disposed opposite to each other. In some embodiments, the first conductive member 105a and the second conductive member 105b extend laterally within the first dielectric layer 104a. In some embodiments, the first conductive member 105a and the second conductive member 105b extend in parallel to each other. In some embodiments, the first conductive member 105a and the second conductive member 105b are disposed over the first die 101. In some embodiments, the first conductive member 105a is disposed over the first die 101, and the second conductive member 105b is disposed over the first molding 102. In some embodiments, the first conductive member 105a and the second conductive member 105b include conductive material such as gold, silver, copper, nickel, tungsten, aluminum, tin and/or alloys thereof.

In some embodiments, the first conductive member 105a is spaced from the second conductive member 105b in a first distance D1. In some embodiments, the first distance D1 between the first conductive member 105a and the second conductive member 105b is substantially greater than 150 um. In some embodiments, the first distance D1 is about 200 um to about 300 um. In some embodiments, a first thickness T1 of the first conductive member 105a and a second thickness T2 of the second conductive member 105b are substantially orthogonal to the second surface 101b of the first die 101. In some embodiments, the first thickness T1 and the second thickness T2 are substantially greater than about 25 um. In some embodiments, the first thickness T1 and the second thickness T2 are about 30 um to about 50 um. In some embodiments, the first distance D1 is substantially greater than the first thickness T1 and the second thickness T2. In some embodiments, the first thickness T1 is substantially equal to the second thickness T2.

In some embodiments, the first thermoelectric member 105c and the second thermoelectric member 105d are disposed between the first conductive member 105a and the second conductive member 105b. In some embodiments, the first thermoelectric member 105c and the second thermoelectric member 105d are adjacent to each other. In some embodiments, the first thermoelectric member 105c and the second thermoelectric member 105d extend substantially in parallel to the second surface 101b of the first die 101 and extend between the first conductive member 105a and the second conductive member 105b. In some embodiments, the first thermoelectric member 105c and the second thermoelectric member 105d are disposed over the first die 101 or the first molding 102.

In some embodiments, the first thermoelectric member 105c and the second thermoelectric member 105d have different Seebeck coefficients. In some embodiments, the first thermoelectric member 105c and the second thermoelectric member 105d are in different conductive types. In some embodiments, the first thermoelectric member 105c includes p-type thermoelectric material, and the second thermoelectric member 105d includes n-type thermoelectric material. In some embodiments, the first thermoelectric member 105c is a P junction, and the second thermoelectric member 105d is an N junction. In some embodiments, the first thermoelectric member 105c includes copper or the like. In some embodiments, the second thermoelectric member 105d includes bismuth telluride ($Bi_2Te_3$), lead telluride (PbTe) or the like.

In some embodiments, the first thermoelectric member 105*c* includes a diffusion barrier layer at both ends of the first thermoelectric member 105*c*. In some embodiments, the second thermoelectric member 105*d* also includes the diffusion barrier layer at both ends of the second thermoelectric member 105*d*. In some embodiments, the diffusion barrier layer includes titanium, gold, copper or the like. In some embodiments, the diffusion barrier layer is disposed between the first thermoelectric member 105*c* and the first conductive member 105*a*, or between the first thermoelectric member 105*c* and second conductive member 105*b*. In some embodiments, the diffusion barrier layer is disposed between the second thermoelectric member 105*d* and the first conductive member 105*a*, or between the second thermoelectric member 105*d* and second conductive member 105*b*. In some embodiments, a width of the diffusion barrier layer is about 250 nm. In some embodiments, the width of the diffusion barrier layer is about 150 nm to about 350 nm.

In some embodiments, the first thermoelectric member 105*c* is spaced from the second thermoelectric member 105*d* in a second distance D2. In some embodiments, the second distance D2 between the first thermoelectric member 105*c* and the second thermoelectric member 105*d* is substantially greater than 8 um. In some embodiments, the second distance D2 is about 10 um. In some embodiments, a third thickness T3 of the first thermoelectric member 105*c* and a fourth thickness T4 of the second thermoelectric member 105*d* are substantially orthogonal to the second surface 101*b* of the first die 101.

In some embodiments, the third thickness T3 and the fourth thickness T4 are substantially greater than about 25 um. In some embodiments, the third thickness T3 and the fourth thickness T4 are about 30 um to about 50 um. In some embodiments, the first distance D1 is substantially greater than the third thickness T3 and the fourth thickness T4. In some embodiments, the first thickness T1 and the second thickness T2 are substantially greater than the third thickness T3 or the fourth thickness T4. In some embodiments, the third thickness T3 is substantially equal to the fourth thickness T4. In some embodiments, the first thickness T1 is substantially greater than the third thickness T3 and the fourth thickness T4. In some embodiments, the second thickness T2 is substantially greater than the third thickness T3 and the fourth thickness T4. In some embodiments, a width of the first thermoelectric member 105*c* or the second thermoelectric member 105*d* is about 100 um to about 200 um.

In some embodiments, the cooling mechanism 105 is operated by application of a voltage. When the voltage is applied to the cooling mechanism 105, there is a temperature difference between the first conductive member 105*a* and the second conductive member 105*b*. As such, a heat can be transferred and dissipated from the first conductive member 105*a* towards the second conductive member 105*b* through the first thermoelectric member 105*c* and the second thermoelectric member 105*d*. For example, a heat generated from the first die 101 can be dissipated by the cooling mechanism 105. The heat is directed from the first conductive member 105*a* towards the second conductive member 105*b*. As a result, the heat can be dissipated towards the periphery of the semiconductor structure 100 or the surroundings.

Further, the cooling mechanism 105 is configured in a minimized thickness. Since the first thermoelectric member 105*c* and the second thermoelectric member 105*d* extend horizontally in the first dielectric layer 104*a*, a thickness of the cooling mechanism 105 is minimized. Therefore, a thickness of the first dielectric layer 104*a* or a thickness of the first RDL 104 is also minimized. As a result, an overall thickness of the semiconductor structure 100 is also be minimized.

In some embodiments, the semiconductor structure 100 includes a second RDL 106 disposed under the first die 101 and the first molding 102. In some embodiments, the second RDL 106 is disposed under the first surface 101*a* of the first die 101. In some embodiments, the second RDL 106 is in configuration similar to the first RDL 104. In some embodiments, the second RDL 106 includes a second dielectric layer 106*a* and a second interconnect structure 106*b* surrounded by the second dielectric layer 106*a*. In some embodiments, the second RDL 106 is a front side RDL.

In some embodiments, the second dielectric layer 106*a* is disposed under the first die 101, the first molding 102 and the via 103. In some embodiments, the second dielectric layer 106*a* is disposed under the first surface 101*a* of the first die 101. In some embodiments, the second dielectric layer 106*a* is in contact with the first molding 102 and the first surface 101*a* of the first die 101. In some embodiments, the second dielectric layer 106*a* includes several layers of dielectric material stacking over each other. In some embodiments, the second dielectric layer 106*a* is a single dielectric layer. In some embodiments, the second dielectric layer 106*a* is multiple dielectric layers. In some embodiments, the second dielectric layer 106*a* includes dielectric material such as silicon oxide, silicon nitride, undoped silicon glass or the like. In some embodiments, the second dielectric layer 106*a* includes polymeric material such as polyimide (PI), polybenzoxazole (PBO) or the like. In some embodiments, each layer of the second dielectric layer 106*a* includes dielectric material different from or same as each other.

In some embodiments, the second interconnect structure 106*b* is surrounded by the second dielectric layer 106*a*. In some embodiments, the second interconnect structure 106*b* is disposed within or over the second dielectric layer 106*a*. In some embodiments, the second interconnect structure 106*b* extends within the second dielectric layer 106*a*. In some embodiments, the second interconnect structure 106*b* extends through one or more layers of the second dielectric layer 106*a*. In some embodiments, the second interconnect structure 106*b* is electrically connected to the first interconnect structure 104*b* through the via 103. In some embodiments, the second interconnect structure 106*b* is electrically connected to the first die 101 through the first die pad 101*c*. In some embodiments, the first die 101 is electrically connected to the first interconnect structure 104*b* through the via 103 and the second interconnect structure 106*b*. In some embodiments, the second interconnect structure 106*b* includes conductive material such as gold, silver, copper, nickel, tungsten, aluminum, tin and/or alloys thereof.

In some embodiments, the second interconnect structure 106*b* includes a second land portion 106*b*-1 and a second via portion 106*b*-2 extended from and coupled with the second land portion 106*b*-1. In some embodiments, the second land portion 106*b*-1 is laterally extended within or over the second dielectric layer 106*a*. In some embodiments, the second via portion 106*b*-2 is vertically extended within the second dielectric layer 106*a* and passes through at least one layer of the second dielectric layer 106*a*. In some embodiments, the second land portion 106*b*-1 and the second via portion 106*b*-2 are stacked over each other. In some embodiments, the second land portion 106*b*-1 and the second via portion 106*b*-2 are stacked alternately.

In some embodiments, a bump pad 107 is disposed under the second RDL 106. In some embodiments, the bump pad 107 is disposed under the second dielectric layer 106a and electrically connected to the second interconnect structure 106b. In some embodiments, the bump pad 107 is electrically coupled with the second via portion 106b-2. In some embodiments, the bump pad 107 is configured to receive a conductive member or the like. In some embodiments, the bump pad 107 is an under bump metallization (UBM) pad. In some embodiments, the bump pad 107 is electrically connected to the first interconnect structure 104b through the via 103 and the second interconnect structure 106b. In some embodiments, the bump pad 107 is electrically connected to the first die 101 through the first die pad 101c and the second interconnect structure 106b. In some embodiments, the bump pad 107 includes gold, silver, copper, nickel, tungsten, aluminum, palladium and/or alloys thereof.

In some embodiments, a conductive bump 108 is disposed under the second RDL 106 and electrically connected to the second interconnect structure 106b. In some embodiments, the conductive bump 108 is disposed under the bump pad 107. In some embodiments, the conductive bump 108 includes conductive material such as includes solder, copper, nickel, gold or etc. In some embodiments, the conductive bump 108 is a solder ball, a ball grid array (BGA) ball, controlled collapse chip connection (C4) bump, a pillar or the like. In some embodiments, the conductive bump 108 is in a spherical, hemispherical or cylindrical shape.

In some embodiments, a second die 110 is disposed over the first RDL 104 and electrically connected to the first interconnect structure 104b. In some embodiments, the second die 110 is disposed over the first dielectric layer 104a. In some embodiments, the second die 110 is fabricated with a predetermined functional circuit within the second die 110 produced by photolithography operations. In some embodiments, the second die 110 is memory die, dynamic random access memory (DRAM) die, high bandwidth memory (HBM) die or the like. In some embodiments, the second die 110 is a chip or a package. In some embodiments, at least a portion of the cooling mechanism 105 is disposed between the first die 101 and the second die 110

In some embodiments, the second die 110 has a top cross section (a cross section from the top view of the semiconductor structure 100 as shown in FIG. 1) in a quadrilateral, a rectangular or a square shape. FIG. 1 illustrates the semiconductor structure 100 includes one second die 110, however it is understood that the semiconductor structure 100 can include more than one second die 110. It is not intended to limit a number of dies in the semiconductor structure 100.

In some embodiments, the second die 110 includes a third surface 110a and a fourth surface 110b opposite to the third surface 110a. In some embodiments, the third surface 110a is a front or active side of the second die 110. In some embodiments, the fourth surface 110b is a back or inactive side of the second die 110.

In some embodiments, the second die 110 includes several second die pads 110c disposed over or within the second die 110. In some embodiments, the second die pad 110c is disposed over the third surface 110a of the second die 110. In some embodiments, the second die pad 110c is electrically connected to a circuitry over or within the second die 110. In some embodiments, the second die pad 110c is configured to electrically connect to a circuitry external to the second die 110. In some embodiments, the second die pad 110c is configured to electrically couple with a conductive trace or a conductive structure.

In some embodiments, the second die pad 110c is electrically connected to the first interconnect structure 104b through a first connector 110d. In some embodiments, the second die pad 110c is electrically connected to the first interconnect structure 104b through the first connector 110d. In some embodiments, the second die 110 is electrically connected to the first die 101 through the first interconnect structure 104b, the via 103 and the second interconnect structure 106b. In some embodiments, the second die 110 is electrically connected to the conductive bump 108 through the first interconnect structure 104b, the via 103, the second interconnect structure 106b and the bump pad 107. In some embodiments, the second die pad 110c is electrically connected to the via 103 through the first interconnect structure 104b. In some embodiments, the first connector 110d is a conductive bump, a conductive pillar or the like. In some embodiments, an underfill material 110e is disposed over the first RDL 104 and encapsulates the first connector 110d. In some embodiments, the underfill material 110e is disposed between the third surface 110a of the second die 110 and the first dielectric layer 104a. In some embodiments, the underfill material 110e includes epoxy or the like.

In some embodiments, the second die pad 110c includes gold, silver, copper, nickel, tungsten, aluminum, palladium and/or alloys thereof. FIG. 1 illustrates only two second die pad 110c over the second die 110 for clarity and simplicity, however, an ordinarily skilled person in the art would readily understand that one or more second die pads 110c can be present over the second die 110.

In some embodiments, a second molding 111 covers the second die 110 and is disposed over the first dielectric layer 104a. In some embodiments, the second molding 111 surrounds the underfill material 110e. In some embodiments, the second molding 111 is in contact with the first dielectric layer 104a, the fourth surface 110b and a sidewall of the second die 110. In some embodiments, at least a portion of the cooling mechanism 105 is disposed between the first molding 102 and the second molding 111. In some embodiments, the second molding 111 can be a single layer film or a composite stack. In some embodiments, the second molding 111 has a high thermal conductivity, a low moisture absorption rate and a high flexural strength. In some embodiments, the second molding 111 includes various materials, such as molding compound, molding underfill, epoxy, resin, or the like.

In some embodiments, a third die 109 is disposed under the second RDL 106 and electrically connected to the second interconnect structure 106b. In some embodiments, the third die 109 is fabricated with a predetermined functional circuit. In some embodiments, the third die 109 is a chip or a package. In some embodiments, the third die 109 is electrically connected to the second interconnect structure 106b through a second connector 109a. In some embodiments, the second connector 109a is a solder joint.

In some embodiments as shown in FIG. 2, the cooling mechanism 105 includes a third conductive member 105e and a fourth conductive member 105f, which have same configurations as the first conductive member 105a and the second conductive member 105b respectively. In some embodiments, the second conductive member 105b is disposed opposite to the first conductive member 105a. In some embodiments, the third conductive member 105e is separated from and disposed adjacent to the first conductive member 105a. In some embodiments, the fourth conductive member 105f is separated from and disposed adjacent to the second conductive member 105b.

In some embodiments, the first conductive member 105a is aligned in coplanar with the third conductive member 105e, and the second conductive member 105b is aligned in coplanar with the fourth conductive member 105f. In some embodiments, the first conductive member 105a, the second conductive member 105b, the third conductive member 105e, the first thermoelectric member 105c and the second thermoelectric member 105d are electrically in series.

In some embodiments, the cooling mechanism 105 includes a third thermoelectric member 105g and a fourth thermoelectric member 105h, which have same configurations as the first thermoelectric member 105c and the second thermoelectric member 105d respectively. In some embodiments, the second thermoelectric member 105d is separated from and disposed adjacent to the first thermoelectric member 105c. In some embodiments, the third thermoelectric member 105g is separated from and disposed adjacent to the second thermoelectric member 105d, and the fourth thermoelectric member 105h is separated from and adjacent to the third thermoelectric member 105g.

In some embodiments, the first thermoelectric member 105c is coupled with the first conductive member 105a and the second conductive member 105b. In some embodiments, the second thermoelectric member 105d is coupled with the second conductive member 105b and the third conductive member 105e. In some embodiments, the third thermoelectric member 105g is coupled with the third conductive member 105e and the fourth conductive member 105f. In some embodiments, the fourth thermoelectric member 105h is coupled with the fourth conductive member 105f. In some embodiments, the first conductive member 105a, the second conductive member 105b, the third conductive member 105e, the fourth conductive member 105f, the first thermoelectric member 105c, the second thermoelectric member 105d, the third thermoelectric member 105g and the fourth thermoelectric member 105h are electrically connected in series.

Figure 3:
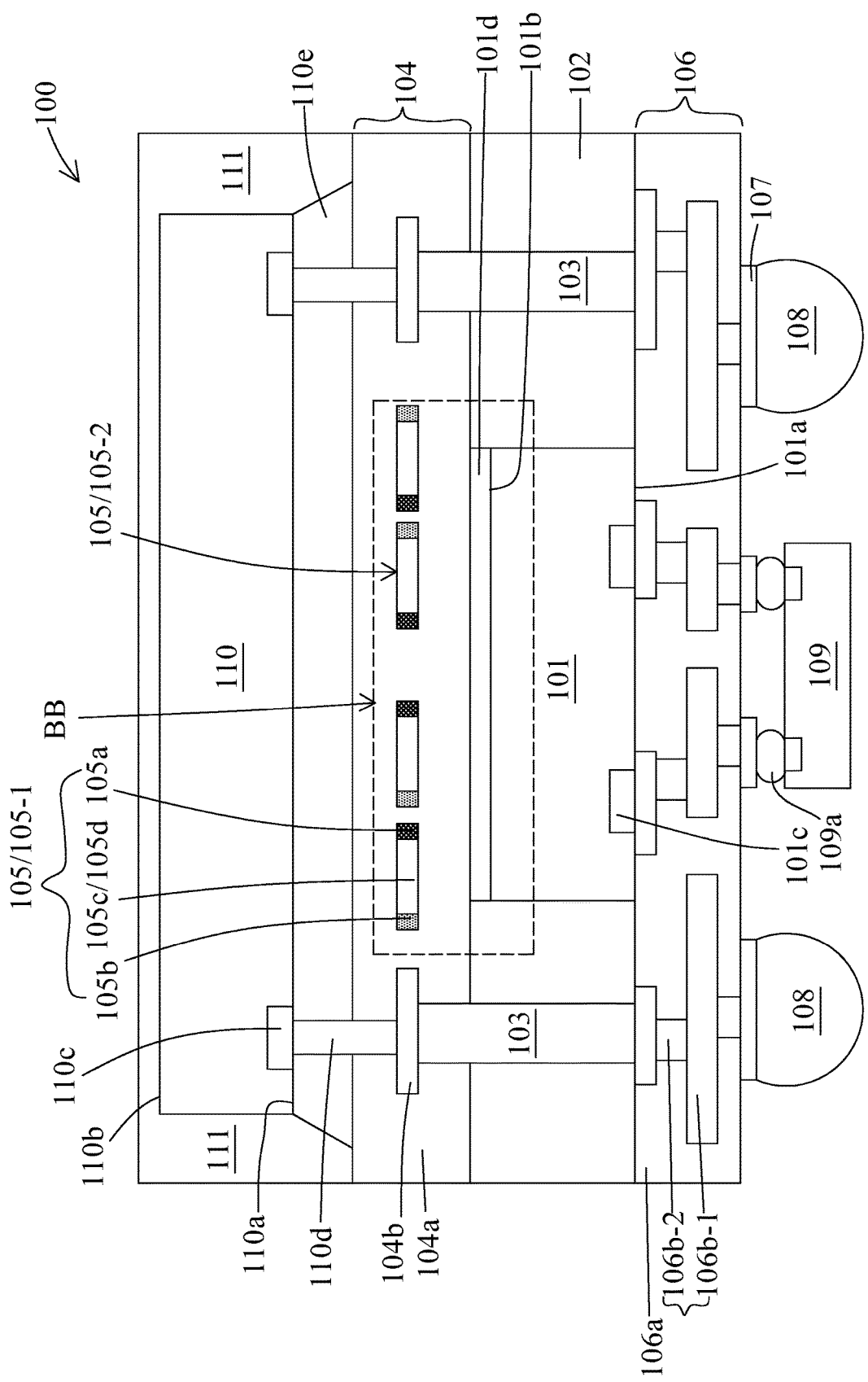
FIG. 3 is a schematic cross-sectional view of a semiconductor structure in accordance with some embodiments of the present disclosure.
Figure 4:
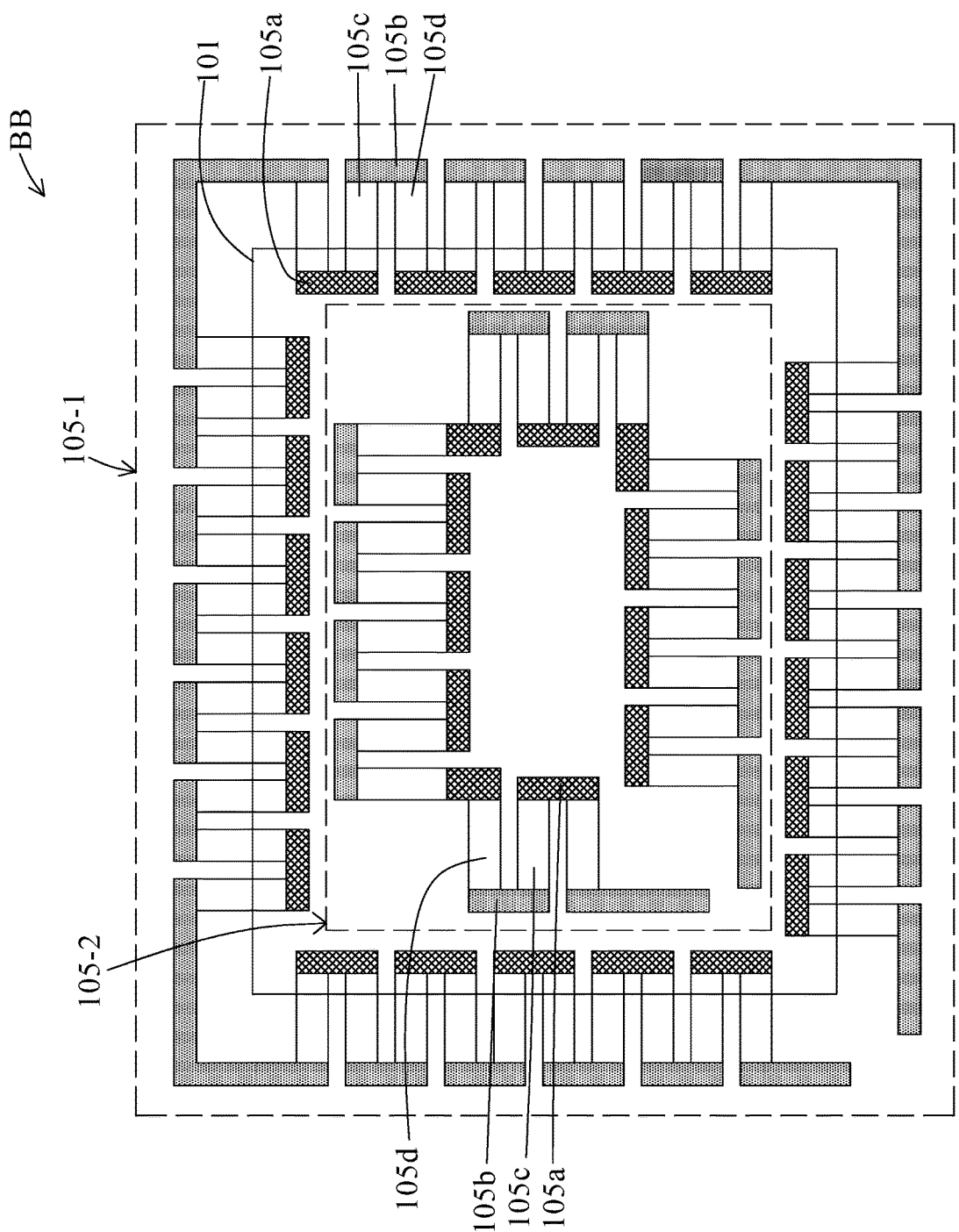
FIG. 4 is an enlarged schematic cross-sectional view of a portion BB of the semiconductor structure in FIG. 3.

FIG. 3 illustrates another embodiment of the cooling mechanism 105 in a schematic cross-sectional view, and FIG. 4 illustrates an enlarged top cross-sectional view of another embodiment of the cooling mechanism 105 in a portion BB of FIG. 3. In some embodiments, the cooling mechanism 105 is configured in a first series 105-1 and a second series 105-2. In some embodiments, the first series 105-1 extends along a periphery of the first RDL 104. In some embodiments, the second series 105-2 is enclosed by the first series 105-1. In some embodiments, the first series 105-1 is isolated from the second series 105-2.

Figure 5:
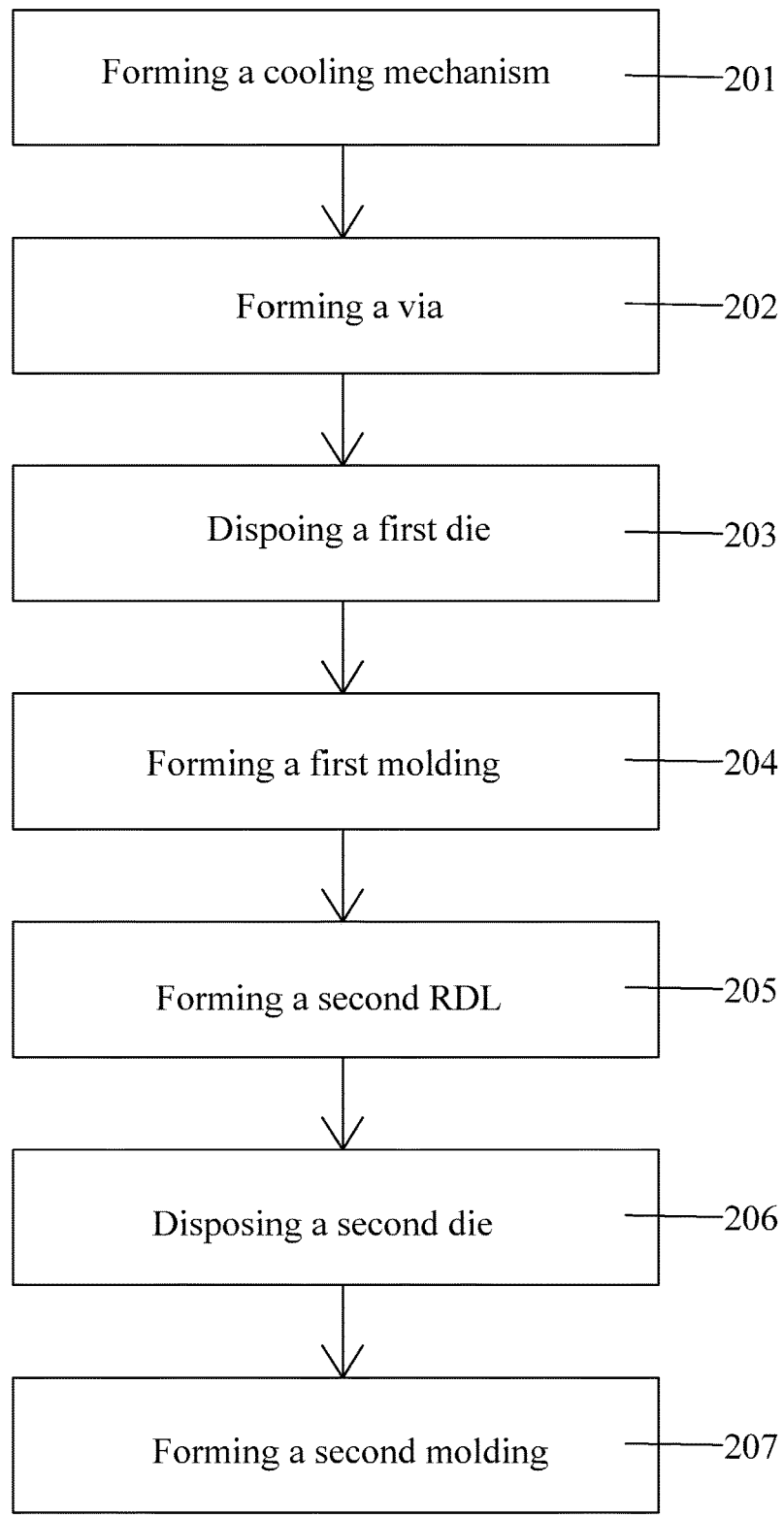
FIG. 5 is a flow diagram of a method of manufacturing a semiconductor structure in accordance with some embodiments of the present disclosure.

In the present disclosure, a method of manufacturing a semiconductor structure 100 is also disclosed. In some embodiments, the semiconductor structure 100 is formed by a method 200. The method 200 includes a number of operations and the description and illustration are not deemed as a limitation as the sequence of the operations. FIG. 5 is an embodiment of the method 200 of manufacturing the semiconductor structure 100. The method 200 includes a number of operations (201, 202, 203, 204, 205, 206 and 207).

Figure 6:
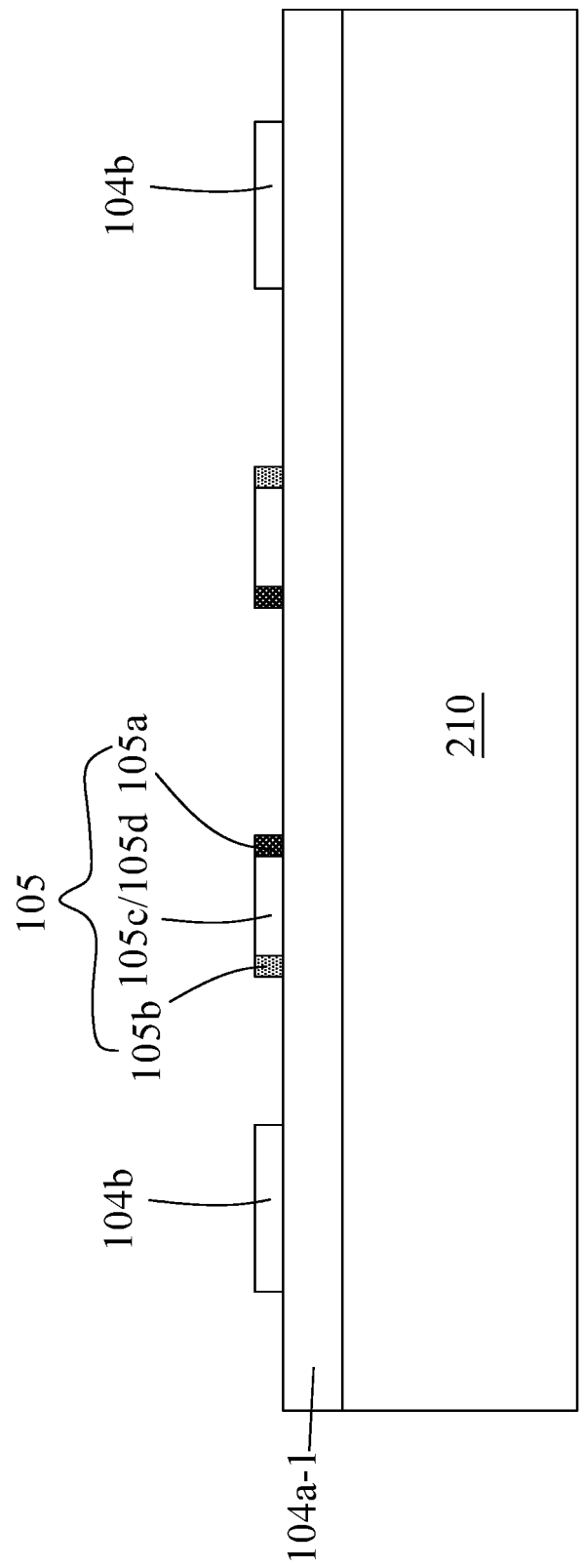
FIGS. 6-16 are schematic views of manufacturing a semiconductor structure by a method of FIG. 5 in accordance with some embodiments of the present disclosure.

In operation 201, a cooling mechanism 105 is formed over a carrier substrate 210 as shown in FIG. 6. In some embodiments the carrier substrate 210 is configured to support several components thereon upon fabrication. In some embodiments, the carrier substrate 210 is a glass substrate. In some embodiments, the carrier substrate 210 has a quadrilateral, rectangular, square, polygonal or any other suitable shape. In some embodiments, a first layer 104a-1 of a first dielectric layer 104 is formed over the carrier substrate 210. In some embodiments, the first layer 104a-1 of the first dielectric layer 104a is deposited by spin coating, chemical vapor deposition (CVD), plasma-enhanced CVD (PECVD), high-density plasma CVD (HDPCVD) or any other suitable operations. In some embodiments, the formation of the cooling mechanism 105 and formation of the first RDL 104 are performed simultaneously or separately.

FIGS. 6A-6F illustrate the formation of the cooling mechanism 105. In some embodiments as shown in FIG. 6A, a first patterned photoresist 212 is disposed over a first layer 104a-1 of the first dielectric layer 104a. In some embodiments, first patterned photoresist 212 is formed by disposing a photoresist material by spin coating or any other suitable operations, and then removing several portions of the photoresist material to form openings by etching or any other suitable operations.

In some embodiments as shown in FIG. 6B, the first thermoelectric member 105c and the second thermoelectric member 105d are disposed within the openings of the first patterned photoresist 212. In some embodiments, the second thermoelectric member 105d is disposed adjacent to the first thermoelectric member 105c. In some embodiments, the first thermoelectric member 105c and the second thermoelectric member 105d are formed by disposing a first thermoelectric material and a second thermoelectric material different from the first thermoelectric material within the openings of the first patterned photoresist 212. In some embodiments, the first thermoelectric material and the second thermoelectric material are disposed by electroplating, sputtering or any other suitable operations.

In some embodiments as shown in FIG. 6C, the first patterned photoresist 212 is removed after the formation of the first thermoelectric member 105c and the second thermoelectric member 105d. In some embodiments, the first thermoelectric member 105c and the second thermoelectric member 105d are in configurations as described above or shown in FIG. 1.

In some embodiments as shown in FIG. 6D, a second patterned photoresist 213 is disposed over the first layer 104a-1 of the first dielectric layer 104a, the first thermoelectric member 105c and the second thermoelectric member 105d. In some embodiments, the second patterned photoresist 213 is formed by disposing a photoresist material by spin coating or any other suitable operations, and then removing several portions of the photoresist material to form openings by etching or any other suitable operations.

In some embodiments as shown in FIG. 6E, the first conductive member 105a and the second conductive member 105b are disposed within the openings of the second patterned photoresist 213. In some embodiments, the first conductive member 105a and the second conductive member 105b are formed by disposing a conductive material within the openings of the second patterned photoresist 213. In some embodiments, the conductive material is disposed by electroplating, sputtering or any other suitable operations. In some embodiments, prior to the formation of the first conductive member 105a and the second conductive member 105b, a seed layer is disposed over the second patterned photoresist 213 and conformal to the openings of the second patterned photoresist 213. In some embodiments, the seed layer includes titanium, gold, copper or the like. In some embodiments, the seed layer is a diffusion barrier layer.

In some embodiments as shown in FIG. 6F, the second patterned photoresist 213 is removed after the formation of the first conductive member 105a and the second conductive member 105b.

Figure 7:
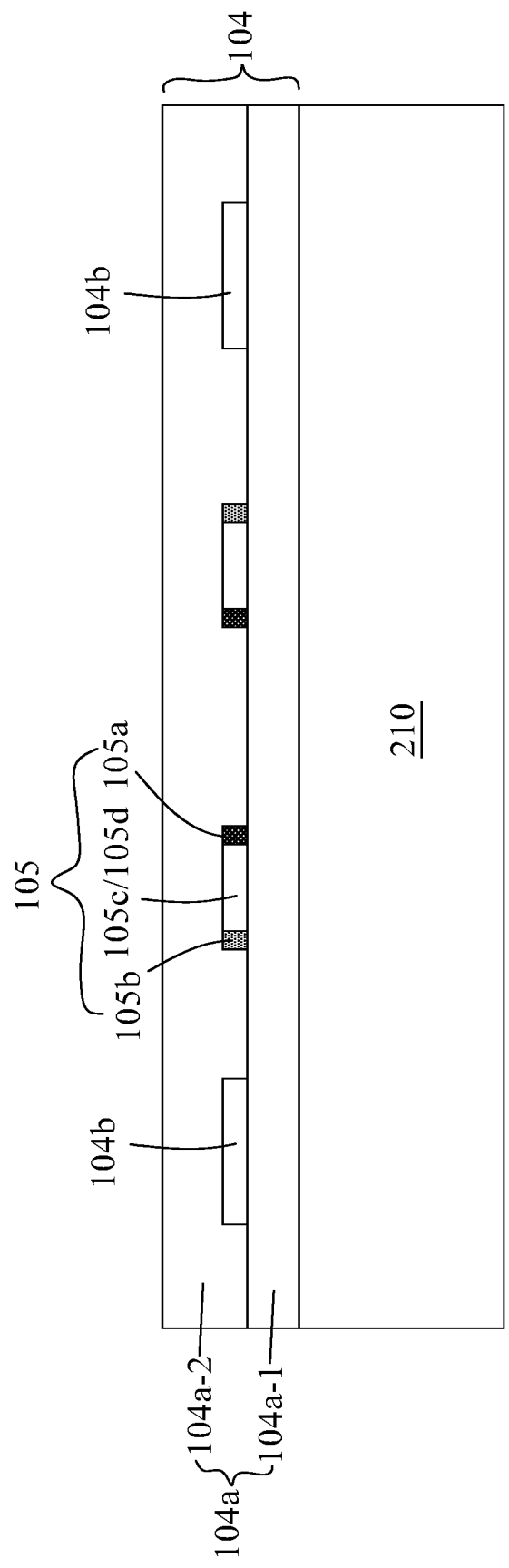

FIG. 7 illustrates the formation of the first RDL 104. In some embodiments, the formation of the first RDL 104 includes forming the first interconnect structure 104b in the first dielectric layer 104a. In some embodiments, the first interconnect structure 104b is formed by disposing a conductive material over the first layer 104a-1 of the first dielectric layer 104a. In some embodiments, the disposing of the conductive material includes sputtering, electroplating or any other suitable operations. In some embodiments, the conductive material includes copper, silver, gold, aluminum, etc.

After the formation of the cooling mechanism 105 and the first interconnect structure 104b, a second layer 104a-2 of the first dielectric layer 104a is disposed over the first layer 104a-1 to cover the cooling mechanism 105 and the first interconnect structure 104b. In some embodiments, the second layer 104a-2 of the first dielectric layer 104a is deposited by spin coating, chemical vapor deposition (CVD), plasma-enhanced CVD (PECVD), high-density plasma CVD (HDPCVD) or any other suitable operations. In some embodiments, the cooling mechanism 105 and the first RDL 104 are in configurations as described above or illustrated in FIG. 1.

Figure 8:
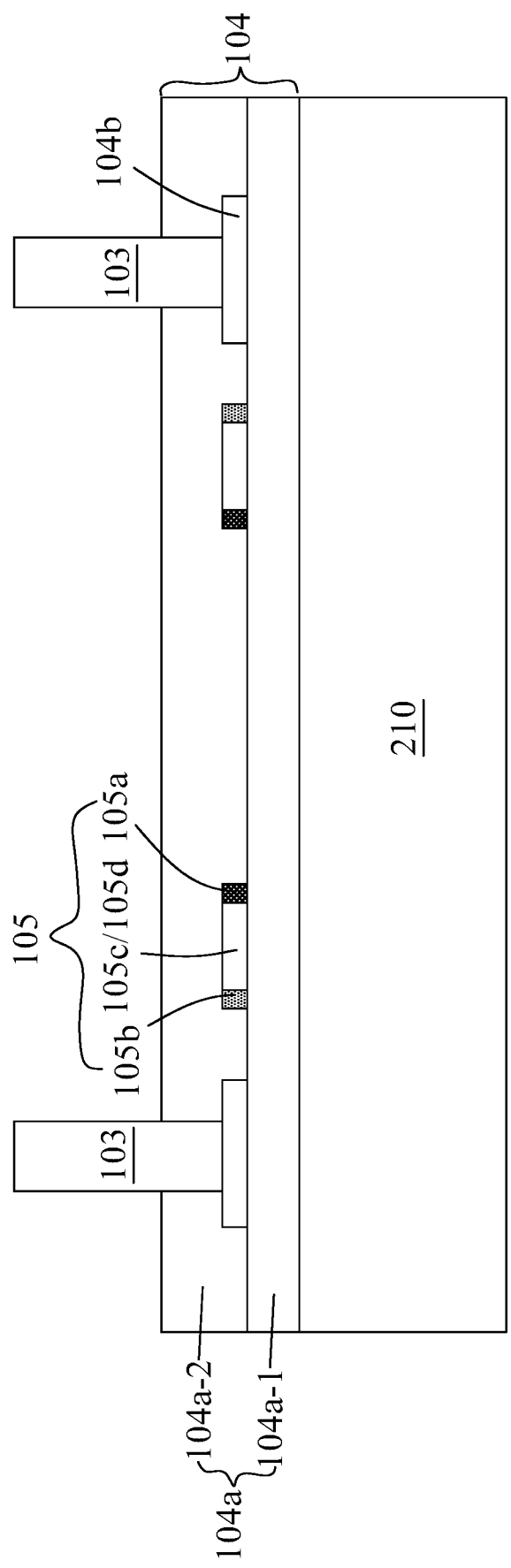

In operation 202, a via 103 is formed as shown in FIG. 8. In some embodiments, the via 103 is formed over and electrically coupled with the first interconnect structure 104b. In some embodiments, a portion of the via 103 is protruded from the first dielectric layer 104a. In some embodiments, the via 103 is formed by disposing a photoresist over the first dielectric layer 104a, removing a portion of the first dielectric layer 104a and patterning the photoresist to form an opening, and then disposing a conductive material into the opening. In some embodiments, the removal of the portion of the first dielectric layer 104a includes photolithography, etching or any other suitable operations. In some embodiments, the disposing of the conductive material includes sputtering, electroplating or any other suitable operations. In some embodiments, the via 103 is in configurations as described above or illustrated in FIG. 1.

Figure 9:
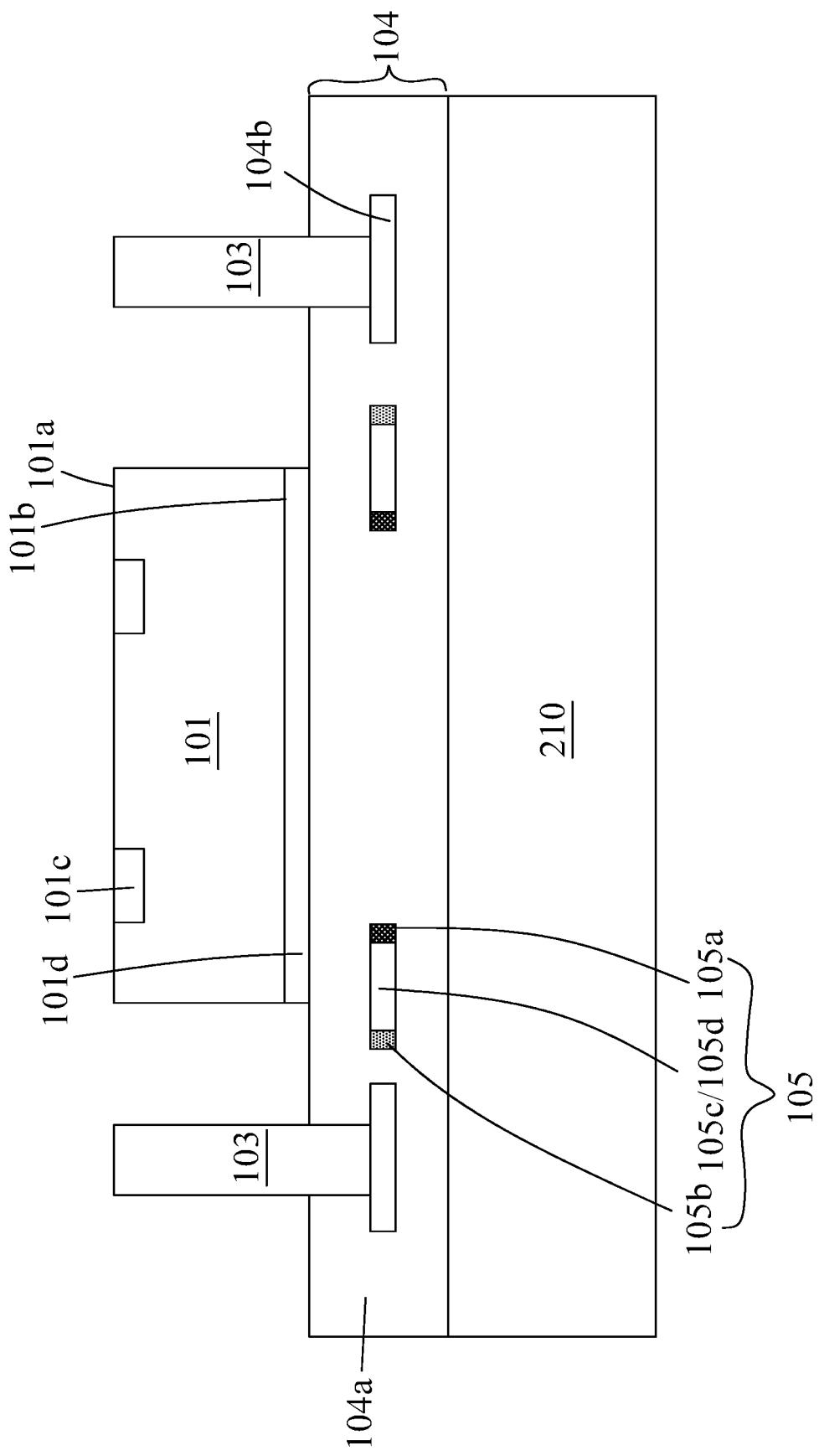

In operation 203 a first die 101 is disposed over the first RDL 104 as shown in FIG. 9. In some embodiments, the first die 101 is a logic device die, central computing unit (CPU) die, a system on chip (SoC) or the like. In some embodiments, the first die 101 includes a first surface 101a, a second surface 101b opposite to the first surface 101a and a first die pad 101c disposed over the first surface 101a. In some embodiments, the first die 101 is attached to the first dielectric layer 104a by an adhesive 101d. In some embodiments, the first surface 101a is an active side that several electrical components are disposed thereon. In some embodiments, the second surface 101b is an inactive side that electrical component disposed thereon is absent. In some embodiments, the first die 101 is in configuration as described above or shown in FIG. 1.

Figure 10:
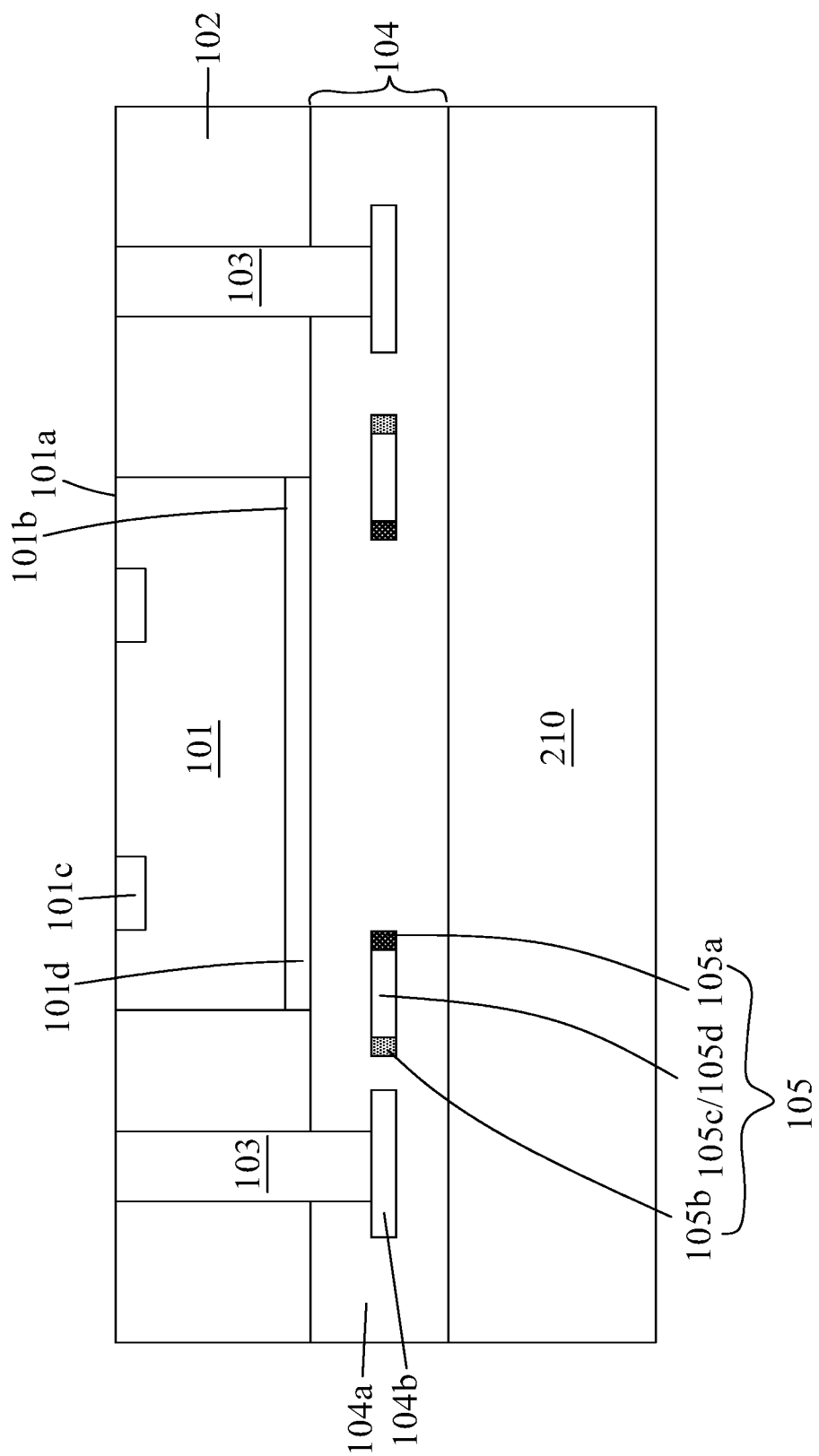

In operation 204, a first molding 102 is formed around the first die 101 as shown in FIG. 10. In some embodiments, the first molding 102 is formed over the first dielectric layer 104a. In some embodiments, the first molding 102 is formed by disposing a molding material over the first dielectric layer 104a to cover the first die 101 and the via 103, and then removing a portion of the molding material to expose the first surface 101a of the first die 101 and a surface of the via 103. In some embodiments, the molding material is disposed by transfer molding, injection molding, over molding or any other suitable operations. In some embodiments, the portion of the molding material is removed by grinding, etching or any other suitable operations. In some embodiments, the first surface 101a of the first die 101 is substantially coplanar with a top surface of the first molding 102. In some embodiments, the via 103 is formed within and extended through the first molding 102. In some embodiments, the via 103 is a through molding via (TMV). In some embodiments, the first molding 102 is in configuration as described above or illustrated in FIG. 1.

Figure 11:
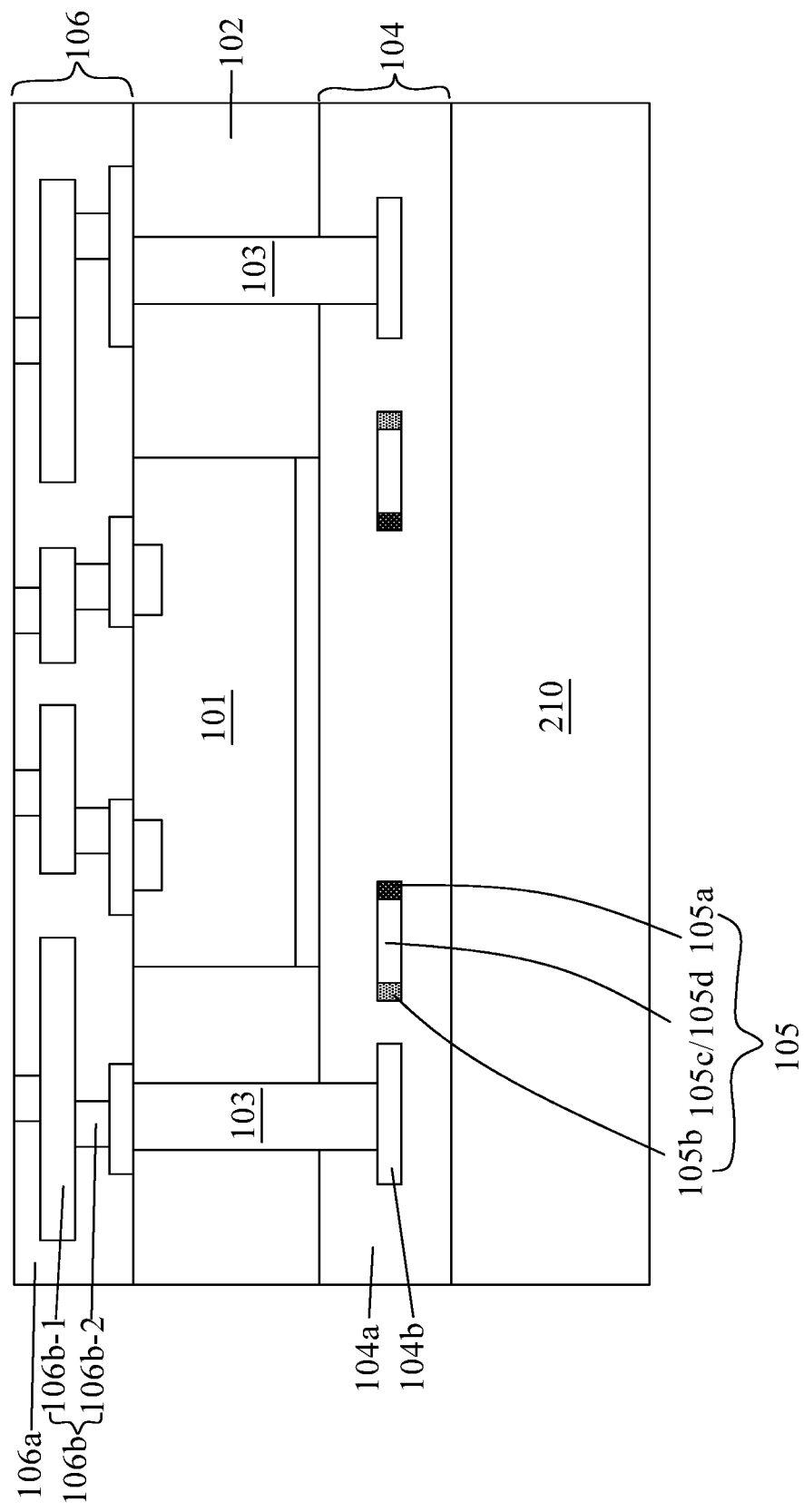

In operation 205, a second RDL 106 is formed over the first die 101 and the first molding 102 as shown in FIG. 11. In some embodiments, the second RDL 106 is formed by disposing a second dielectric layer 106a and forming a second interconnect structure 106b in the second dielectric layer 106a. In some embodiments, the second dielectric layer 106a is disposed over the first die 101 and the first molding 102. In some embodiments, the second dielectric layer 106a is deposited by spin coating, chemical vapor deposition (CVD), plasma-enhanced CVD (PECVD), high-density plasma CVD (HDPCVD) or any other suitable operations. In some embodiments, the second RDL 106 is in configuration as described above or illustrated in FIG. 1.

In some embodiments, the second interconnect structure 106b is formed by removing a portion of the second dielectric layer 106a to form an opening and then disposing a conductive material into the opening. In some embodiments, the removal of the portion of the second dielectric layer 106a includes photolithography, etching or any other suitable operations. In some embodiments, the disposing of the conductive material includes sputtering, electroplating or any other suitable operations. In some embodiments, the conductive material includes copper, silver, gold, aluminum, etc. In some embodiments, the second interconnect structure 106b extends through at least one layer of the second dielectric layer 106a. In some embodiments, the second interconnect structure 106b is electrically connected to the via 103. In some embodiments, the second interconnect structure 106b is electrically connected to the first die 101 through the first die pad 101c.

In some embodiments, the formation of the second interconnect structure 106b includes forming a second land portion 106b-1 and forming a second via portion 106b-2 coupled with the second land portion 106b-1. In some embodiments, the second land portion 106b-1 and the second via portion 106b-2 are stacked alternately. In some embodiments, the second land portion 106b-1 is formed by disposing a patterned photoresist over the second dielectric layer 106, removing a portion of the second dielectric layer 106 exposed from the patterned photoresist to form an opening, and then disposing a conductive material into the opening. In some embodiments, the second via portion 106b-2 is formed by removing a portion of the second dielectric layer 106a to form an opening, and then disposing a conductive material into the opening.

Figure 12:
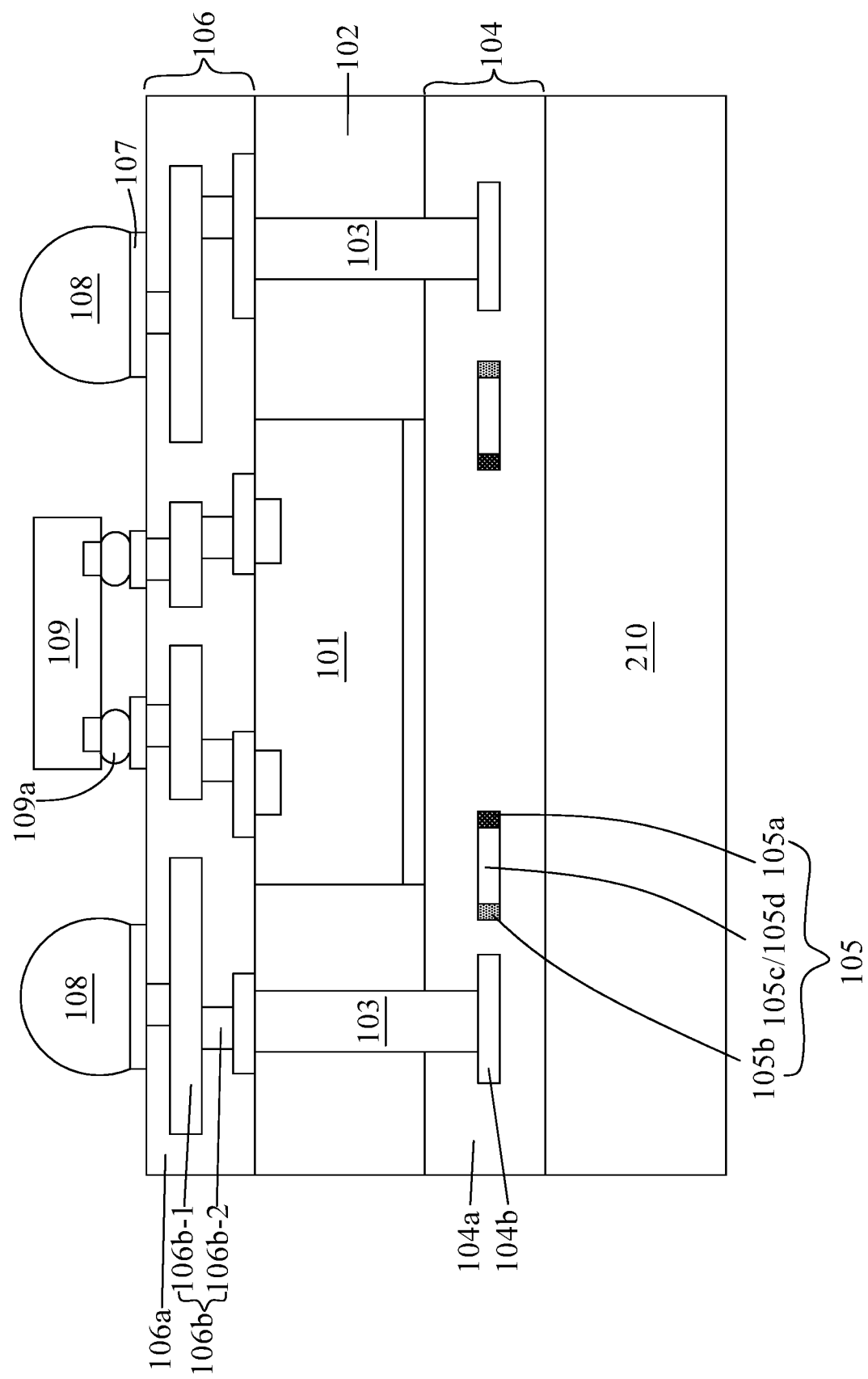

In some embodiments as shown in FIG. 12, a bump pad 107 and a conductive bump 108 are formed over the second RDL 106. In some embodiments, the bump pad 107 is formed over or on the second interconnect structure 106b. In some embodiments, the bump pad 107 is formed over or surrounded by the second dielectric layer 106a. In some embodiments, the bump pad 107 is electrically connected to the second interconnect structure 106b. In some embodiments, the bump pad 107 is formed by evaporation, sputtering, electroplating or any other suitable operations. In some embodiments, the bump pad 107 is in configuration as described above or illustrated in FIG. 1.

In some embodiments as shown in FIG. 12, the conductive bump 108 is formed over and bonded with the bump pad 107. In some embodiments, the conductive bump 108 is disposed by ball dropping, solder pasting, stencil printing or any other suitable operations. In some embodiments, the conductive bump 108 is electrically connected t0 the first die 101 through the second interconnect structure 106b and the bump pad 107. In some embodiments, the conductive bump 108 is in configuration as described above or illustrated in FIG. 1.

Figure 13:
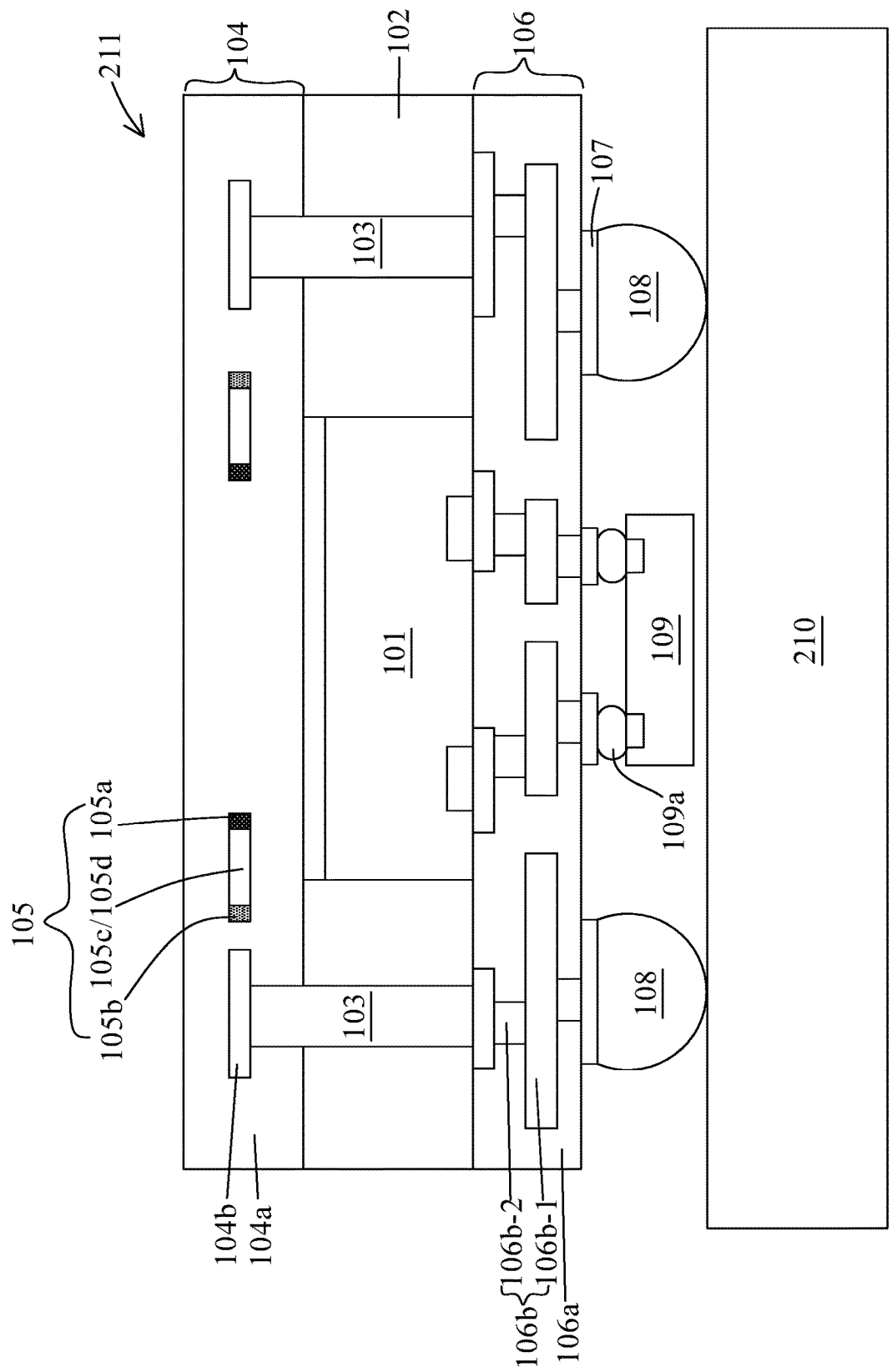

In some embodiments as shown in FIG. 12, a third die 109 is bonded over the second RDL 106. In some embodiments, the third die 109 is mounted over the second RDL 106 by a connector 109a, so that the third die 109 is electrically connected to the first die 101 through the second interconnect structure 106b. In some embodiments, the third die 109 is in configuration as described above or illustrated in FIG. 1. In some embodiments, the carrier substrate 210 is debonded and an intermediate structure 211 is flipped and then disposed over the carrier substrate 210 as shown in FIG. 13.

Figure 14:
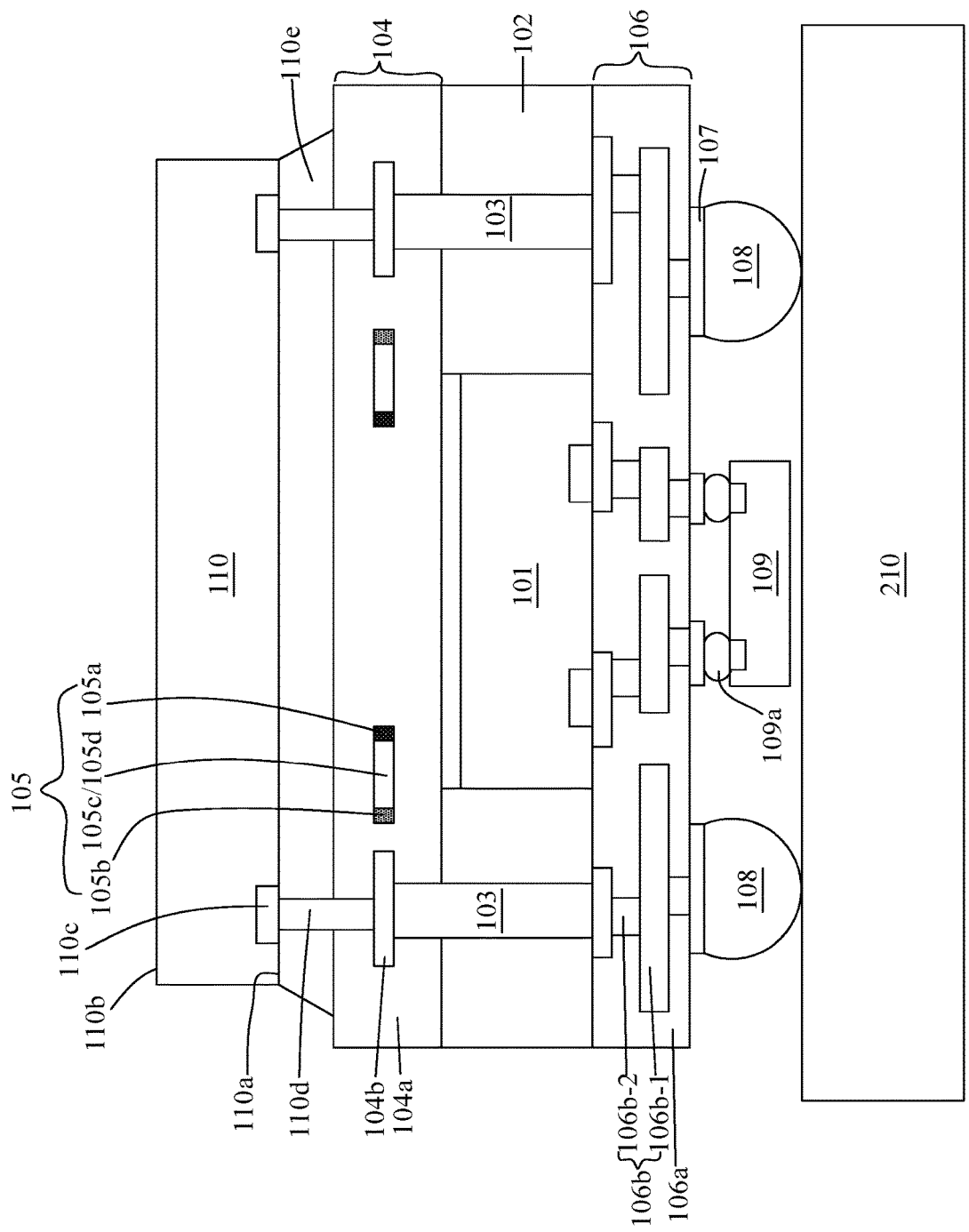

In operation 206, a second die 110 is provided or received, and then disposed over the first die 101, the first molding 102, the first RDL 104 and the cooling mechanism 105 as shown in FIG. 14. In some embodiments, the second die 110 is memory die, dynamic random access memory (DRAM) die, high bandwidth memory (HBM) die or the like. In some embodiments, the second die 110 includes a second die pad 110c disposed over or within the second die 110. In some embodiments, the second die pad 110c is electrically connected to the first interconnect structure 104b through a first connector 110d, such that the second die 110 is electrically connected to the first die 101 through the first interconnect structure 104b, the via 103 and the second interconnect structure 106b. In some embodiments, an underfill material 110e is disposed between the second die 110 and the first RDL 104. In some embodiments, the second die 110 is in configuration as described above or illustrated in FIG. 1.

Figure 15:
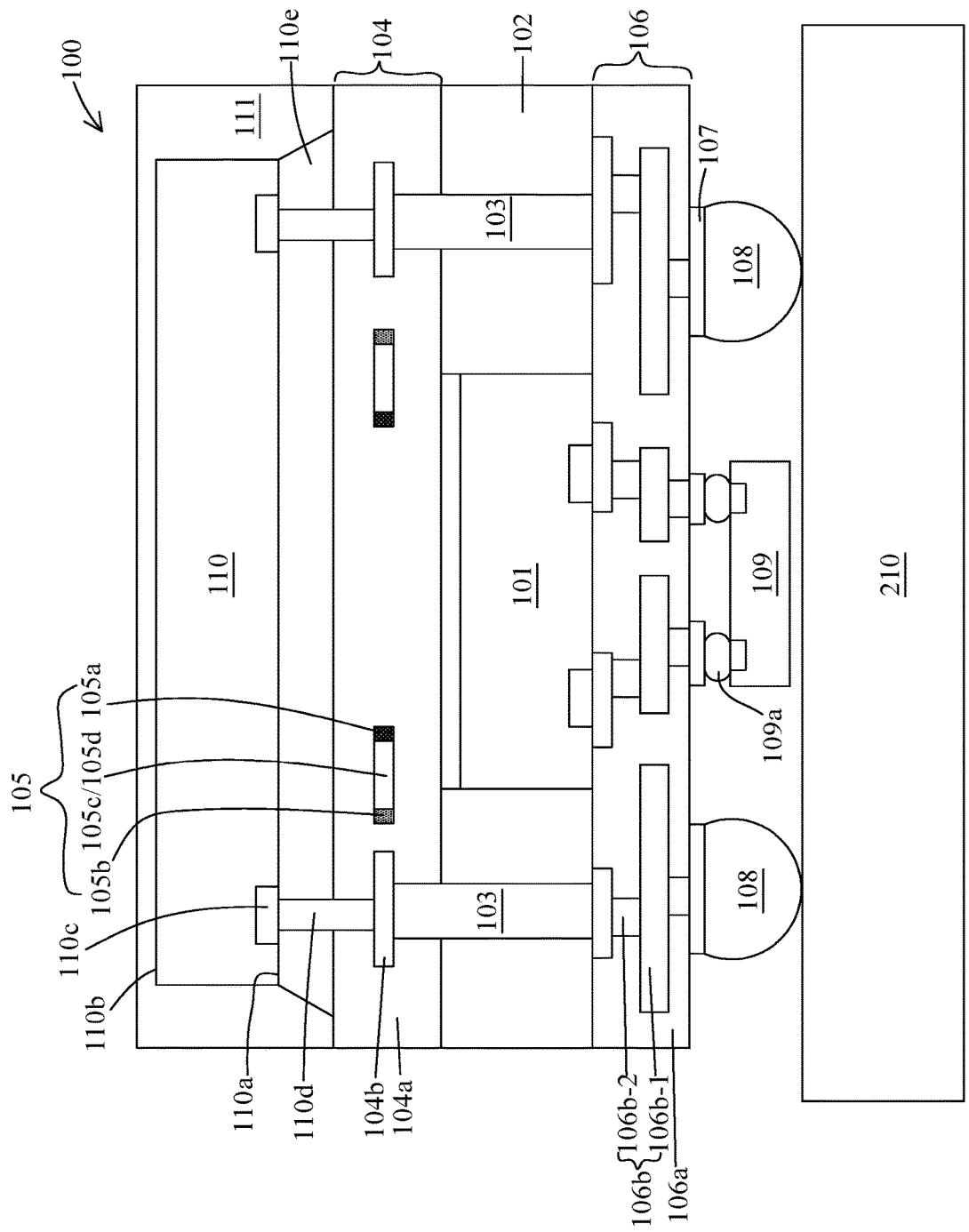
Figure 16:
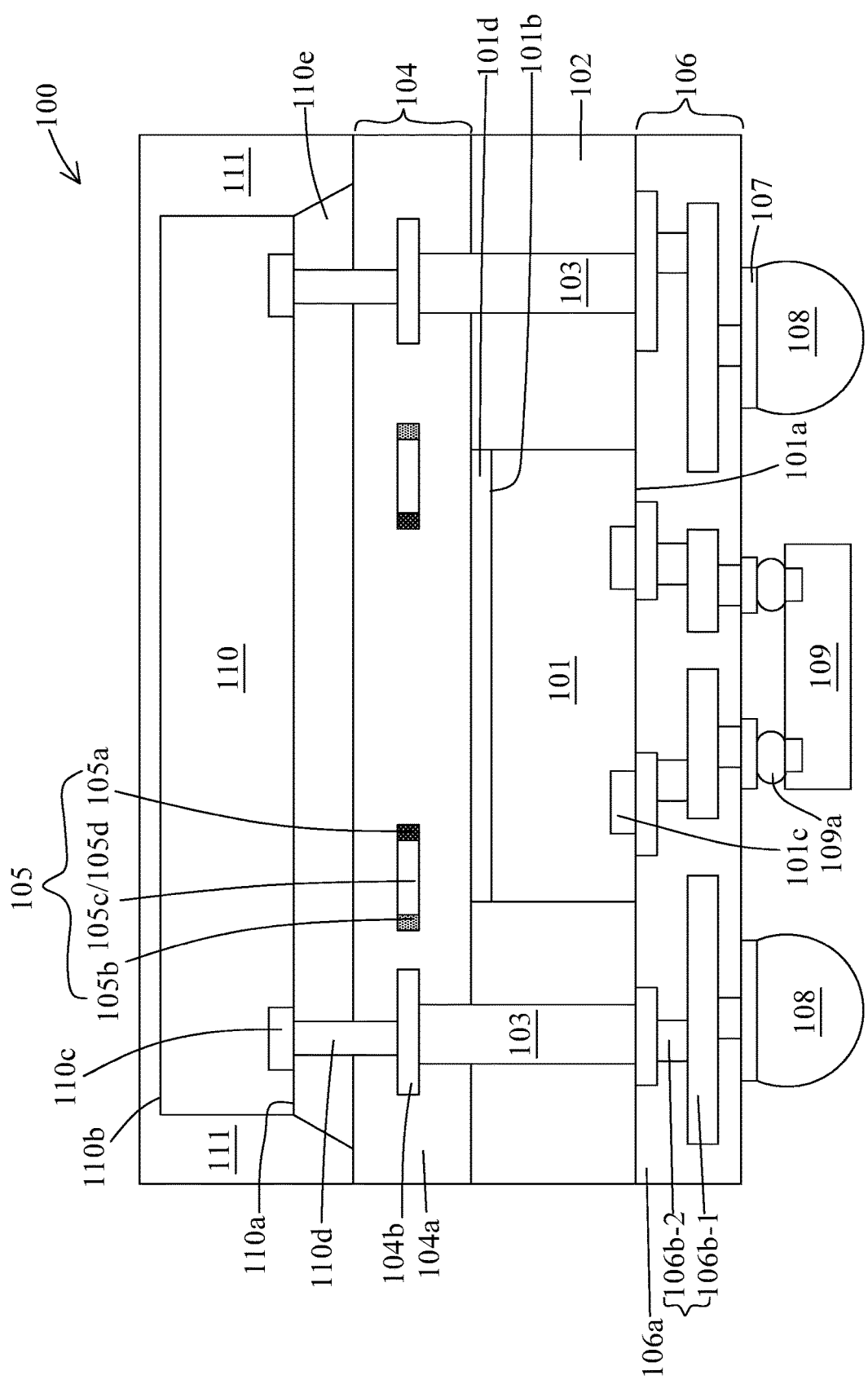

In operation 207, a second molding 111 is formed around the second die 110 as shown in FIG. 15. In some embodiments, the second molding 111 is formed over the first dielectric layer 104a and covers the second die 110. In some embodiments, the second molding 111 is formed by disposing a molding material over the first dielectric layer 104a to cover the second die 110. In some embodiments, the molding material is disposed by transfer molding, injection molding, over molding or any other suitable operations. In some embodiments, the second molding 111 is in configuration as described above or illustrated in FIG. 1. In some embodiments, the carrier substrate 210 is removed as shown in FIG. 16, and a semiconductor structure 100 as shown in FIG. 1 is formed.

In the present disclosure, a semiconductor structure is disclosed. The semiconductor structure includes a first die including a first surface and a second surface opposite to the first surface; a first molding surrounding the first die; and a first redistribution layer (RDL) disposed over the second surface of the first die and the first molding, and including a first dielectric layer, a first interconnect structure surrounded by the first dielectric layer, and a cooling mechanism disposed within the first dielectric layer, wherein the cooling mechanism includes a first conductive member, a second conductive member disposed opposite to the first conductive member, a first thermoelectric member and a second thermoelectric member adjacent to the first thermoelectric member; and wherein the first thermoelectric member and the second thermoelectric member extend substantially in parallel to the second surface of the first die and extend between the first conductive member and the second conductive member.

In some embodiments, a first thickness of the first thermoelectric member and a second thickness of the second thermoelectric member are substantially orthogonal to the second surface of the first die, and a distance between the first conductive member and the second conductive member is substantially greater than the first thickness and the second thickness. In some embodiments, the distance between the first conductive member and the second conductive member is about 200 um to about 300 um. In some embodiments, the first thickness and the second thickness are about 30 um to 50 um.

In some embodiments, the first conductive member is disposed over the first die, and the second conductive member is disposed over the first molding. In some embodiments, the first thermoelectric member and the second thermoelectric member are in different conductive types. In some embodiments, the first thermoelectric member includes p-type thermoelectric material, and the second thermoelectric member includes n-type thermoelectric material. In some embodiments, the first thermoelectric member includes copper (Cu), and the second thermoelectric member includes bismuth telluride ($Bi_2Te_3$).

In some embodiments, the semiconductor structure further includes a second RDL disposed over first surface of the first die and the first molding, and including a second dielectric layer and a second interconnect structure; a second die disposed over the first RDL and electrically connected to the first interconnect structure; a second molding covering the second die and disposed over the first dielectric layer; a via extending through the first molding. In some embodiments, at least a portion of the cooling mechanism is disposed between the first die and the second die or disposed between the first molding and the second molding. In some embodiments, the first interconnect structure is electrically connected to the second interconnect structure through the via. In some embodiments, the semiconductor structure further includes a conductive bump disposed under the second RDL and electrically connected to the second interconnect structure; a third die disposed under the second RDL and electrically connected to the second interconnect structure.

In some embodiments, a semiconductor structure includes a die; a molding surrounding the die; and a redistribution layer (RDL) disposed over the die and the molding, and including a dielectric layer and a cooling mechanism disposed within the dielectric layer, wherein the cooling mechanism includes a first conductive member, a second conductive member disposed opposite to the first conductive member, a third conductive member separated from and disposed adjacent to the first conductive member, a first thermoelectric member and a second thermoelectric member separated from and disposed adjacent to the first thermoelectric member; and wherein the first thermoelectric member is coupled with the first conductive member and the second conductive member, and the second thermoelectric member is coupled with the second conductive member and the third conductive member.

In some embodiments, the first conductive member, the second conductive member, the third conductive member, the first thermoelectric member and the second thermoelectric member are electrically in series. In some embodiments, the semiconductor structure further includes a fourth conductive member separated from and disposed adjacent to the second conductive member; a third thermoelectric member separated from and disposed adjacent to the second thermoelectric member, wherein the third thermoelectric member is coupled with the third conductive member and the fourth conductive member. In some embodiments, the first conductive member, the second conductive member, the third conductive member, the fourth conductive member, the first thermoelectric member, the second thermoelectric member and the third thermoelectric member are electrically connected in series. In some embodiments, the cooling mechanism includes a first series extending along a periphery of the first RDL and a second series enclosed by the first series.

In some embodiments, a method of manufacturing a semiconductor structure includes providing a first die including a first surface and a second surface opposite to the first surface; forming a first molding around the first die; and forming a cooling mechanism over the first molding and the second surface of the first die, wherein the formation of the cooling mechanism includes: forming a dielectric layer; forming a first thermoelectric member over the dielectric layer; forming a second thermoelectric member over the dielectric layer and adjacent to the first thermoelectric member; disposing a patterned photoresist over the dielectric layer, the first thermoelectric member and the second thermoelectric member; forming a first conductive member and a second conductive member over the dielectric layer and within an opening of the patterned photoresist; and wherein the first thermoelectric member and the second thermoelectric member extend substantially in parallel to the second surface of the first die and extend between the first conductive member and the second conductive member.

In some embodiments, the first thermoelectric member and the second thermoelectric member are formed by electroplating operations. In some embodiments, the method further includes disposing a seed layer over the patterned photoresist and conformal to the opening; disposing a second die over the first die, the first molding and the cooling mechanism; forming a second molding around the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor structure, comprising:
 a first die including a first surface and a second surface opposite to the first surface;
 a first molding surrounding the first die; and
 a first redistribution layer (RDL) disposed over the second surface of the first die and the first molding, and including a first dielectric layer, a first interconnect structure surrounded by the first dielectric layer, and a cooling mechanism disposed within the first dielectric layer,
 wherein the cooling mechanism includes a first conductive member, a second conductive member disposed opposite to the first conductive member, a first thermoelectric member and a second thermoelectric member adjacent to the first thermoelectric member; and
 wherein the first thermoelectric member and the second thermoelectric member extend substantially in parallel to the second surface of the first die and extend between the first conductive member and the second conductive member.

2. The semiconductor structure of claim 1, wherein a first thickness of the first thermoelectric member and a second thickness of the second thermoelectric member are substantially orthogonal to the second surface of the first die, and a distance between the first conductive member and the second conductive member is substantially greater than the first thickness and the second thickness.

3. The semiconductor structure of claim 2, wherein the distance between the first conductive member and the second conductive member is about 200 um to about 300 um.

4. The semiconductor structure of claim 2, wherein the first thickness and the second thickness are about 30 um to 50 um.

5. The semiconductor structure of claim 1, wherein the first conductive member is disposed over the first die, and the second conductive member is disposed over the first molding.

6. The semiconductor structure of claim 1, wherein the first thermoelectric member and the second thermoelectric member are in different conductive types.

7. The semiconductor structure of claim 1, wherein the first thermoelectric member includes p-type thermoelectric material, and the second thermoelectric member includes n-type thermoelectric material.

8. The semiconductor structure of claim 1, wherein the first thermoelectric member includes copper (Cu), and the second thermoelectric member includes bismuth telluride ($Bi_2Te_3$).

9. The semiconductor structure of claim 1, further comprising:
 a second RDL disposed over first surface of the first die and the first molding, and including a second dielectric layer and a second interconnect structure;
 a second die disposed over the first RDL and electrically connected to the first interconnect structure;
 a second molding covering the second die and disposed over the first dielectric layer;
 a via extending through the first molding.

10. The semiconductor structure of claim 9, wherein at least a portion of the cooling mechanism is disposed between the first die and the second die or disposed between the first molding and the second molding.

11. The semiconductor structure of claim 9, wherein the first interconnect structure is electrically connected to the second interconnect structure through the via.

12. The semiconductor structure of claim 9, further comprising:
 a conductive bump disposed under the second RDL and electrically connected to the second interconnect structure;
 a third die disposed under the second RDL and electrically connected to the second interconnect structure.

13. A semiconductor structure, comprising:
 a die;
 a molding surrounding the die; and
 a redistribution layer (RDL) disposed over the die and the molding, and including a dielectric layer and a cooling mechanism disposed within the dielectric layer,
 wherein the cooling mechanism includes a first conductive member, a second conductive member disposed opposite to the first conductive member, a third conductive member separated from and disposed adjacent to the first conductive member, a first thermoelectric member and a second thermoelectric member separated from and disposed adjacent to the first thermoelectric member; and wherein the first thermoelectric member is coupled with the first conductive member and the second conductive member, and the second thermoelectric member is coupled with the second conductive member and the third conductive member.

14. The semiconductor structure of claim 13, wherein the first conductive member, the second conductive member, the third conductive member, the first thermoelectric member and the second thermoelectric member are electrically in series.

15. The semiconductor structure of claim 13, further comprising:
 a fourth conductive member separated from and disposed adjacent to the second conductive member;
 a third thermoelectric member separated from and disposed adjacent to the second thermoelectric member, wherein the third thermoelectric member is coupled with the third conductive member and the fourth conductive member.

16. The semiconductor structure of claim 15, wherein the first conductive member, the second conductive member, the third conductive member, the fourth conductive member, the first thermoelectric member, the second thermoelectric member and the third thermoelectric member are electrically connected in series.

17. The semiconductor structure of claim 13, wherein the cooling mechanism includes a first series extending along a periphery of the first RDL and a second series enclosed by the first series.

18. A method of manufacturing a semiconductor structure, comprising:
 providing a first die including a first surface and a second surface opposite to the first surface;
 forming a first molding around the first die; and
 forming a cooling mechanism over the first molding and the second surface of the first die, wherein the formation of the cooling mechanism includes:
  forming a dielectric layer;
  forming a first thermoelectric member over the dielectric layer;
  forming a second thermoelectric member over the dielectric layer and adjacent to the first thermoelectric member;
  disposing a patterned photoresist over the dielectric layer, the first thermoelectric member and the second thermoelectric member;
  forming a first conductive member and a second conductive member over the dielectric layer and within an opening of the patterned photoresist; and
 wherein the first thermoelectric member and the second thermoelectric member extend substantially in parallel to the second surface of the first die and extend between the first conductive member and the second conductive member.

19. The method of claim 18, wherein the first thermoelectric member and the second thermoelectric member are formed by electroplating operations.

20. The method of claim 18, further comprising:
 disposing a seed layer over the patterned photoresist and conformal to the opening;
 disposing a second die over the first die, the first molding and the cooling mechanism;
 forming a second molding around the second die.

* * * * *